(12) United States Patent
Yamazaki

(10) Patent No.: US 7,109,073 B2
(45) Date of Patent: Sep. 19, 2006

(54) METHOD FOR FABRICATING SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 131 days.

(21) Appl. No.: 10/219,815

(22) Filed: Aug. 16, 2002

(65) Prior Publication Data

US 2004/0106237 A1 Jun. 3, 2004

(30) Foreign Application Priority Data

Aug. 17, 2001 (JP) .................................... 2001-248346

(51) Int. Cl.
*H01L 21/00* (2006.01)

(52) U.S. Cl. .................. 438/150; 438/164; 438/482; 438/487

(58) Field of Classification Search ............... 438/149, 438/150, 160, 164, 168, 180, 187, 198, 482, 438/485–488, 507, 509, 689
See application file for complete search history.

(56) References Cited

U.S. PATENT DOCUMENTS

| 4,309,225 A | 1/1982 | Fan et al. |
| 4,330,363 A | 5/1982 | Biegesen et al. |
| 4,536,231 A | 8/1985 | Kasten |

(Continued)

FOREIGN PATENT DOCUMENTS

| EP | 0878789 A2 | 11/1998 |
| EP | 1045447 A2 | 10/2000 |
| EP | 1 058 311 A2 | 12/2000 |
| JP | 52-104117 | 5/1987 |
| JP | 02-140915 | 5/1990 |
| JP | 02-181419 | 7/1990 |
| JP | 06-289431 | 10/1994 |
| JP | 07-092501 | 4/1995 |
| JP | 08-195357 | 7/1996 |
| JP | 10-319907 | 12/1998 |
| JP | 10-339889 | 12/1998 |
| JP | 11-271731 | 10/1999 |
| JP | 2000-221907 | 8/2000 |
| JP | 2000-356788 | 12/2000 |
| TW | 409293 | 10/2000 |
| WO | WO-00-13213 | 3/2000 |

OTHER PUBLICATIONS

Hara et al., "Ultra–High Performance Poly–Si TFTs on a Glass by a Stable Scanning CW Laser Lateral Crystallization", pp. 227–230, 2001, AM–LCD, TFT3–1.

(Continued)

*Primary Examiner*—Asok Kumar Sarkar
(74) *Attorney, Agent, or Firm*—Nixon Peabody LLP; Jeffrey L. Costellia

(57) ABSTRACT

To provide technology that allows, by controlling a crystal orientation, forming a crystalline semiconductor film aligned in orientation and obtaining a crystalline semiconductor film whose impurity concentration is reduced.

On an insulating surface, a first semiconductor region made of an amorphous semiconductor is formed, a continuous wave laser beam is scanned from one end of the first semiconductor region to the other end thereof, thereby the first semiconductor region is once melted and crystallized, thereafter in order to form an active layer of a TFT the first semiconductor region is etched, and thereby a second semiconductor region is formed. In a pattern of the second semiconductor region formed by the etching, in order to improve a field-effect mobility in the TFT, a scanning direction of the laser beam is allowed roughly coinciding with a channel length direction in a thin film transistor.

12 Claims, 21 Drawing Sheets

U.S. PATENT DOCUMENTS

| | | | |
|---|---|---|---|
| 4,822,752 A | | 4/1989 | Sugahara et al. |
| 5,336,879 A | | 8/1994 | Sauer |
| 5,432,122 A | * | 7/1995 | Chae .......................... 438/157 |
| 5,521,107 A | | 5/1996 | Yamazaki et al. |
| 5,583,369 A | | 12/1996 | Yamazaki et al. |
| 5,589,406 A | | 12/1996 | Kato et al. |
| 5,650,636 A | | 7/1997 | Takemura et al. |
| 5,712,191 A | | 1/1998 | Nakajima et al. |
| 5,729,308 A | | 3/1998 | Yamazaki et al. |
| 5,789,763 A | | 8/1998 | Kato et al. |
| 5,824,574 A | * | 10/1998 | Yamazaki et al. .......... 438/150 |
| 5,904,770 A | | 5/1999 | Ohtani et al. |
| 5,929,464 A | | 7/1999 | Yamazaki et al. |
| 5,932,893 A | | 8/1999 | Miyanaga et al. |
| 5,937,282 A | | 8/1999 | Nakajima et al. |
| 5,943,593 A | | 8/1999 | Noguchi et al. |
| 5,946,561 A | | 8/1999 | Yamazaki et al. |
| 5,953,597 A | | 9/1999 | Kusumoto et al. |
| 5,956,603 A | | 9/1999 | Talwar et al. |
| 5,976,959 A | | 11/1999 | Huang |
| 5,981,974 A | | 11/1999 | Makita |
| 6,013,928 A | | 1/2000 | Yamazaki et al. |
| 6,096,581 A | | 8/2000 | Zhang et al. |
| 6,100,860 A | | 8/2000 | Takayama et al. |
| 6,204,099 B1 | | 3/2001 | Kusumoto et al. |
| 6,232,156 B1 | | 5/2001 | Ohtani et al. |
| 6,242,289 B1 | | 6/2001 | Nakajima et al. |
| 6,265,745 B1 | | 7/2001 | Kusumoto et al. |
| 6,417,031 B1 | | 7/2002 | Ohtani et al. |
| 6,417,896 B1 | | 7/2002 | Yamazaki et al. |
| 6,465,268 B1 | | 10/2002 | Hirakata et al. |
| 6,475,840 B1 | | 11/2002 | Miyanaga et al. |
| 6,479,837 B1 | * | 11/2002 | Ogawa et al. ................. 257/59 |
| 6,498,369 B1 | | 12/2002 | Yamazaki et al. |
| 6,509,212 B1 | | 1/2003 | Zhang et al. |
| 6,515,428 B1 | | 2/2003 | Yeh et al. |
| 6,552,768 B1 | | 4/2003 | Matsuda |
| 6,556,711 B1 | | 4/2003 | Koga |
| 6,582,996 B1 | | 6/2003 | Hara et al. |
| 6,646,288 B1 | | 11/2003 | Yamazaki et al. |
| 6,661,180 B1 | | 12/2003 | Koyama |
| 6,709,905 B1 | | 3/2004 | Kusumoto et al. |
| 6,730,550 B1 | | 5/2004 | Yamazaki et al. |
| 6,737,672 B1 | | 5/2004 | Hara et al. |
| 6,743,650 B1 | | 6/2004 | Hirakata et al. |
| 2001/0045563 A1 | | 11/2001 | Kusumoto et al. |
| 2001/0051398 A1 | | 12/2001 | Hirakata et al. |
| 2002/0014623 A1 | | 2/2002 | Kusumoto et al. |
| 2002/0097350 A1 | | 7/2002 | Haven et al. |
| 2003/0016196 A1 | | 1/2003 | Lueder et al. |
| 2003/0017634 A1 | | 1/2003 | Hirakata et al. |
| 2003/0024905 A1 | | 2/2003 | Tanaka |
| 2003/0025166 A1 | | 2/2003 | Yamazaki et al. |
| 2003/0047732 A1 | | 3/2003 | Yamazaki et al. |
| 2003/0052336 A1 | | 3/2003 | Yamazaki et al. |
| 2003/0059990 A1 | | 3/2003 | Yamazaki et al. |
| 2003/0062845 A1 | | 4/2003 | Yamazaki et al. |
| 2003/0075733 A1 | | 4/2003 | Yamazaki et al. |
| 2003/0100169 A1 | | 5/2003 | Tamaka et al. |
| 2004/0106237 A1 | | 6/2004 | Yamazaki |

OTHER PUBLICATIONS

Takeuchi et al., "Performance of Poly–Si TFTs Fabricated by a Stable Scanning CW Laser Crystallization", pp. 251–254, 2001, AM–LCD, TFT4–3.

Specifications and Drawings for U.S. Appl. No. 09/633,869.

U.S. Appl. No. 10/238,050; filed Sep. 10, 2002 "Light Emitting Device and Method of Manufacturing Semiconductor Device" (Filing Receipt, Specification, Claims and Drawings).

U.S. Appl. No. 10/224,628; filed Aug. 21, 2002 "Method for Manufacturing Semiconductor Device" (Filing Receipt, Specification, Claims and Drawings).

"Society for Information Display International Symposium Digest of Technical Papers" (SID) Inukai et al., Jan. 1, 2000, pp. 924–927.

U.S. Appl. No. 09/633,869; filed Aug. 7, 2000; Hongyong Zhang et al. "Method for Laser Processing Semiconductor Device".

* cited by examiner

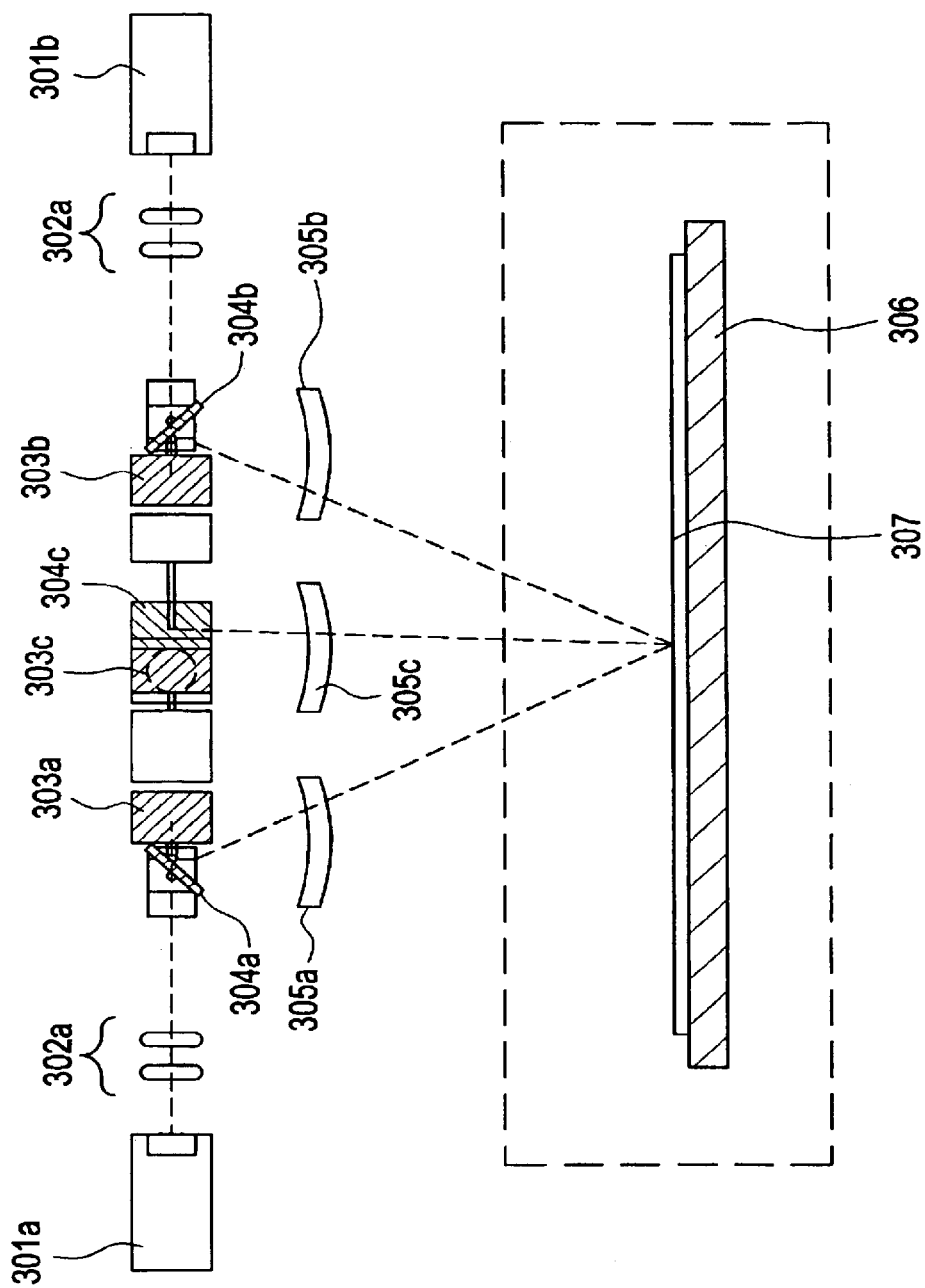

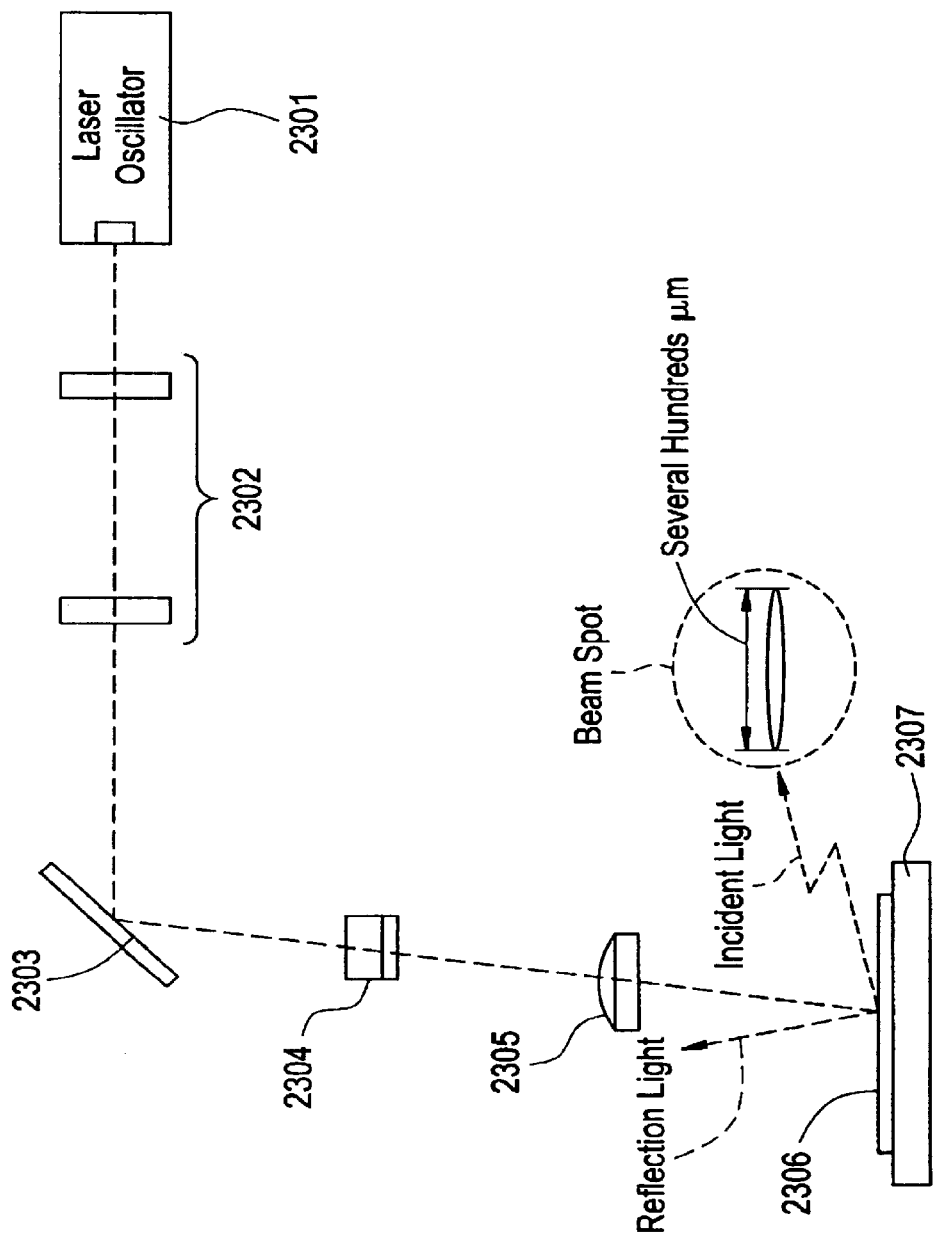

METHOD FOR FABRICATING SEMICONDUCTOR DEVICE

DETAILED DESCRIPTION OF THE INVENTION

1. Technical Field to Which the Invention Belongs

The present invention relates to a method for fabricating a semiconductor device by use of a laser beam. In particular, the present invention relates to a method for fabricating a semiconductor device having a process of crystallizing an amorphous semiconductor film by use of a laser beam.

2. Prior Art

A technology in which an amorphous semiconductor film formed on an insulating surface such as glass or the like is crystallized by use of laser annealing is being developed. The laser annealing denotes a technology of recrystallizing a damaged layer or an amorphous layer formed on a semiconductor substrate or a semiconductor film, or a technology of crystallizing an amorphous semiconductor film formed on a substrate. Applicable laser oscillators are a gas laser typical in an excimer laser and a solid laser typical in a YAG laser. It is known that by irradiating the laser beam for only a short time, a semiconductor can be heated and crystallized.

There are examples of existing laser annealing methods disclosed in patent publications. That is, as shown in JP-A-2-181419 a laser beam is uniformly irradiated on an entire surface of a subject being irradiated, as shown in JP-A-62-104117 a spot-like laser beam is scanned, or as in a laser processor disclosed in JP-A-8-195357, an optical system processes a laser beam into a line followed by irradiating.

The JP-A-62-104117 discloses a technology in which a scanning speed of a laser beam is set at spot diameter ×5000/second or more, and thereby an amorphous semiconductor film is poly-crystallized without undergoing a complete melting state. Furthermore, U.S. Pat. No. 4,330,363 discloses a technology in which an extended laser beam is irradiated on a semiconductor region formed in islands, and thereby a substantially single crystal region is formed.

Features of the laser annealing are in that in comparison with an annealing method that utilizes radiation heating or heat-transfer heating, a processing time can be largely shortened, and by selectively and locally heating a semiconductor or a semiconductor film, a substrate is hardly damaged thermally.

In recent years, the laser annealing has been actively utilized in the formation of a polycrystalline silicon film on a glass substrate, the process being applied in the fabrication of thin-film transistors (TFTs) that are used as switching elements of a liquid crystal display device. When the excimer laser is used, since only a region where a semiconductor film is formed is thermally affected, cheaper glass substrates can be used for developing high definition displays.

Since a TFT fabricated from a polycrystalline silicon film crystallized by use of the laser annealing can be operated in a relatively higher frequency region, not only a switching element disposed to a pixel but also a driving circuit can be formed on a glass substrate. A design-rule in patterning is in the range of substantially 5 to 20 µm, and in each of a driving circuit and a pixel portion, TFTs in number of $10^6$ to $10^7$ pieces are fabricated on the glass substrate.

[Problems that the Invention is to Solve]

Although the crystallization of an amorphous silicon film according to the laser annealing undergoes a process of melting to solidification, it is considered that in detail the process is divided into stages of the formation of crystal nucleuses and the crystal growth from the nucleuses. However, the laser annealing that uses a pulse laser beam cannot control a growth position and a growth density of the crystal nucleuses and depends only on the crystal nucleuses occurring spontaneously. Accordingly, crystal grains are formed at arbitrary positions in a plane of the glass substrate, and furthermore a size thereof can be obtained only in the range of substantially 0.2 to 0.5 µm. Usually, since a large number of defects are formed at a grain boundary, these are considered to be a factor that limits a field-effect mobility of the TFT.

In the pulse laser annealing that is said be formed in a non-melting region, since a crystal growth caused by the crystal nucleuses is dominant, larger sizes of crystal grains cannot be realized. Specifically, a substantially single crystalline crystal from a viewpoint of an element level, such as that there is no grain boundary in a channel region of the TFT, cannot be formed.

Without restricting to the grain boundary, defects or dislocations, according to densification accompanying the crystallization, are generated when a volume of the film is contracted. In particular, it is pointed out that the defects accompanying the volume contraction, in a semiconductor film divided into islands, are generated at an outer periphery thereof.

On the other hand, a method in which while the semiconductor film is melted and solidified by scanning a continuous wave laser beam the crystallization is advanced is considered a method close to a zone melting method and a method that can realize larger crystal grains owing to a continuous crystal growth. However, there is a problem in that according to the crystallinity of a region that is initially crystallized and becomes a seed, the quality of a crystal being obtained is determined.

Wavelengths of the laser beam capable of heating the semiconductor film are over a wide range of from an ultraviolet region to an infrared region. However, in order to selectively heat the semiconductor film or the semiconductor region formed on the substrate, from an absorption coefficient of the semiconductor, a laser beam having a wavelength in the ultraviolet to visible light region is considered preferable. However, a light of a solid laser in which a relatively high output can be obtained even in the visible light region is strong in coherency and causes interference in an irradiated surface. Accordingly, it is difficult to irradiate a uniform laser beam.

Furthermore, in the crystallization due to the continuous wave laser beam that keeps a melting state for a time longer than in the case of the pulse laser beam, since a ratio with which foreign impurities are taken in a crystal increases and the foreign impurities segregate, even when the crystallinity is improved, defects due to the impurities are formed, resulting in deterioration of crystal quality.

The present invention is carried out in view of the above situations. The present invention intends to provide technology with which a crystal orientation is controlled, thereby a crystalline semiconductor film is formed with crystal orientation thereof aligned, and a crystalline semiconductor film having a reduced impurity concentration is formed.

[Means for Solving the Problems]

In order to overcome the problems, a method of fabricating a semiconductor device of the present invention includes; forming a first semiconductor region made of an amorphous semiconductor on an insulating surface formed of silicon oxide or silicon nitride or a mixture thereof, or aluminum oxide or aluminum nitride or a mixture thereof;

scanning a continuous wave laser beam from one end of the first semiconductor region to the other end thereof, and thereby once melting the first semiconductor region and crystallizing it; and thereafter etching the first semiconductor region and forming an active layer of the TFT, and thereby forming a second semiconductor region. In the above, in order to improve the field-effect mobility in the TFT, in a pattern of the second semiconductor region formed by etching, a scanning direction of the laser beam is made roughly coincide with a channel length direction in a thin film transistor.

To the first semiconductor region, one that is formed in a predetermined pattern by etching an amorphous semiconductor film formed on an insulating surface is applied. That is, it needs only be formed of the amorphous semiconductor film. As another aspect, it may be crystallized beforehand.

A method for fabricating a semiconductor device in this case includes; forming an amorphous semiconductor film on an insulating surface; adding a catalyst element followed by heating and crystallizing the amorphous semiconductor film, and thereby forming a crystalline semiconductor film; etching the crystalline semiconductor film and forming a first semiconductor region; scanning a continuous wave laser beam from one end of the first semiconductor region to the other end thereof, and thereby improving crystallinity of the first semiconductor region; and thereafter etching the first semiconductor region, and thereby forming a second semiconductor region so that a scanning direction of the laser beam may roughly coincide with a channel length direction in a TFT.

Alternatively, a method for fabricating a semiconductor device includes; forming an amorphous semiconductor film on an insulating surface; after a selective addition of a catalyst element, heating the amorphous semiconductor film, thereby crystallizing the amorphous semiconductor film from a region where the catalyst element is selectively added to a direction in parallel with the insulating surface, and thereby forming a crystalline semiconductor film; etching the crystalline semiconductor film and forming a first semiconductor region; in the first semiconductor region, scanning a continuous wave laser beam in a direction roughly coinciding with a crystal growth direction, and thereby improving the crystallinity of the first semiconductor region; and thereafter etching the first semiconductor region, and thereby forming a second semiconductor region so that the scanning direction of the laser beam may roughly coincide with a channel length direction in the TFT.

To a method adequate for previously determining a crystal orientation of the second semiconductor region that is finally formed as an active layer of the TFT, one in which before the crystallization of the first semiconductor region, a seed region that comes into contact with the first semiconductor region and becomes a seed is formed beforehand is applied.

A method for fabricating a semiconductor device in this case includes; forming a first amorphous semiconductor film on an insulating surface; adding a catalyst element followed by heating and crystallizing the amorphous semiconductor film, and thereby forming a first crystalline semiconductor film; etching the first crystalline semiconductor film, and thereby forming a first semiconductor region; forming on the insulating surface a second amorphous semiconductor film that overlaps with the first semiconductor region; etching the second amorphous semiconductor film, and thereby forming a second semiconductor region at least partially overlapping with the first semiconductor region; in the second semiconductor region, scanning a continuous wave laser beam from one end that overlaps with the first semiconductor region to the other end thereof, and thereby crystallizing the second semiconductor region; and thereafter etching the first semiconductor region and the second semiconductor region, and thereby forming a third semiconductor region so that a scanning direction of the laser beam may roughly coincide with a channel length direction in a TFT.

Alternatively, as another configuration, a method for fabricating a semiconductor device includes; forming a first amorphous semiconductor film containing silicon and germanium on an insulating surface; adding a catalyst element followed by heating and crystallizing the amorphous semiconductor film, and thereby forming a first crystalline semiconductor film; etching the first crystalline semiconductor film and forming a seed crystal region; forming on the insulating surface a second amorphous semiconductor film overlapping with the seed crystal region; etching the second amorphous semiconductor film, and thereby forming a first semiconductor region at least partially overlapping with the seed crystal region; in the first semiconductor region, scanning a continuous wave laser beam from one end that overlaps with the seed crystal region to the other end thereof, and thereby crystallizing the first semiconductor region; and thereafter etching the seed crystal region and the first semiconductor region, and thereby forming a second semiconductor region so that a scanning direction of the laser beam may roughly coincide with a channel length direction in a TFT.

When an amorphous semiconductor film containing silicon and germanium is crystallized with a catalyst element added thereto, a crystalline semiconductor film high in a degree of orientation in {101} plane can be obtained. A concentration of germanium necessary to allow developing such an action is known, according to experimental results, to be 0.1 atomic percent or more and 10 atomic percent or less relative to silicon, being preferable to be 1 atomic percent or more and 5 atomic percent or less. When the concentration of germanium is the upper limit value or more, since natural nucleuses (nucleuses being generated irrespective of a compound with a metal element being added) occurring as an alloy material of silicon and germanium are generated conspicuously, the degree of orientation of the obtained polycrystalline semiconductor film cannot be improved. Furthermore, when the concentration of germanium is the lower limit value or less, since a sufficient distortion cannot be generated, in this case also the degree of orientation cannot be improved. When the crystalline semiconductor film high in the degree of orientation is made a seed region, the degree of orientation of the finally formed third semiconductor region can be heightened, resulting in a crystalline semiconductor having a single orientation.

As applicable catalyst elements, one kind or a plurality of kinds selected from Fe, Co, Ni, Ru, Rh, Pd, Os, Ir, Pt, Cu and Au is used. Furthermore, the amorphous semiconductor film is formed with a thickness in the range of 10 nm to 200 nm. When an amorphous silicon film is heated with the metal element added, a compound between silicon and the metal element (silicide) is formed and when the compound diffuses the crystallization proceeds. Germanium added to the amorphous silicon film does not react with the compound and remains in the surroundings thereof, resulting in causing local distortion. The distortion works in a direction to make larger a critical radius of nucleus generation, reduces the nucleus generation density, and has an effect of limiting the orientation of the crystal.

In the crystalline semiconductor film, as a means for removing the catalyst elements used in crystallizing and the impurities incorporated from the outside when undergoing a melting state, a gettering process can be applied. As a gettering site that forms a distortion field (a region where the impurities are allowed to segregate), an amorphous semiconductor or a crystalline semiconductor to which phosphorus or an element of 18th group in the periodic table such as argon or the like is added is suitable. According to the gettering process, the catalyst elements or other metal elements that are mingled during the crystallization can be removed, resulting in a reduction in the density of the defects caused by the impurities.

In the configuration of the invention, for a substrate thereon the insulating surface is formed, alkali-free glass typical in barium borosilicate glass and alumino-borosilicate glass, quartz, and a semiconductor substrate such as a silicon wafer can be used.

To a laser oscillator that radiates a laser beam that is used in crystallizing, a gas laser oscillator and a solid laser oscillator can be used, in particular a laser oscillator capable of continuously oscillating being applied. As the continuous wave solid laser oscillator, the laser oscillator that uses a doped crystal such as Nd, Tm, or Ho-doped YAG, $YVO_4$, YLF, or $YAlO_3$ can be used. A wavelength of a fundamental wave of oscillation wavelengths, though different depending on doped materials, is in the range of 1 μm to 2 μm. When the amorphous semiconductor film is crystallized, in order to allow the semiconductor film to selectively absorb the laser beam, it is preferable to apply the laser beam having a wavelength in the visible to ultraviolet region and to use the second to fourth harmonic wave of the fundamental wave. In order to obtain higher harmonic waves, a wavelength-converting element is used. Typically, when an amorphous semiconductor film is crystallized, a second harmonic of Nd: $YVO_4$ laser (fundamental wavelength: 1064 nm) is used. Other than this, gas laser oscillators such as an argon gas laser and a krypton gas laser can be used.

Anyway, from a viewpoint of the absorption coefficient of the semiconductor film, the continuous wave laser beam is preferable to have a wavelength in the range of 400 nm to 700 nm. When the wavelength of a light is longer than the above value, since the absorption coefficient of the semiconductor is small, a power density is necessary to be increased to melt, resulting in subjecting even the substrate to thermal damage. Furthermore, when a light having a wavelength shorter than the above value is used, since almost all the laser beam is absorbed at the surface of the semiconductor, the inside thereof cannot be heated, resulting in the domination of random crystal growth influenced by a surface state.

A laser beam radiated from a solid laser oscillator is strong in its coherency and interference occurs at an irradiated surface. Accordingly, as a measure to cancel out this, a configuration in which a plurality of laser beams radiated from different laser oscillators is superposed at an irradiated portion is adopted. By configuring thus, not only the interference is removed but also a substantial energy density at the irradiated portion can be increased. Furthermore, as another means, a plurality of laser beams radiated from different laser oscillators may be superposed into one optical axis in the middle of the optical system.

A configuration of a laser processor equipped with a means for removing the interference can be realized in one that has an n (the n is a natural number) sets of optical systems, wherein the nth optical system includes a nth laser oscillator, a deflection means for operating the laser beam in a nth Y axis direction, a deflection means for scanning a laser beam in a nth X axis direction, and a nth f-theta lens, and wherein n laser beams focused and deflected by use of the n sets of optical systems irradiate a substantial same position of a subject being processed. For the deflecting means, a galvanometer mirror can be applied.

With the above configuration of the laser processor, a laser beam having an energy density sufficient to melt a semiconductor, without causing the interference at the irradiated portion, can be irradiated. When a position of the laser beam is controlled and scanned with the deflection means, even in a larger area substrate, only a particular region where a semiconductor region is formed can be processed. Accordingly, a throughput in the crystallization process can be improved.

The amorphous semiconductor film in the present invention includes not only ones that have a complete amorphous structure in a narrow definition but also states where fine crystal grains are contained, or so-called microcrystalline semiconductor films and semiconductor films that contain locally the crystalline structure. Typically, an amorphous silicon film is applied, and other than this, an amorphous silicon germanium film, an amorphous silicon carbide film and so on can be applied.

MODE FOR CARRYING OUT THE INVENTION

[Embodiment 1]

In the following, modes for carrying out the present invention will be explained with reference to the drawings. A perspective view shown in FIG. 1A illustrates a state where a blocking layer 102 and a first semiconductor region 103 are formed on a substrate 101. For a material forming the semiconductor region, silicon, a compound or an alloy between silicon and germanium, or a compound or an alloy between silicon and carbon can be used. Among these, silicon is the most suitable one.

From the first semiconductor region 103, an active layer 104 of a TFT is formed at a position shown by a dotted line. The active layer 104 is formed in the inside that does not reach an end portion of the semiconductor region 103. The present active layer includes a channel formation region of the TFT, and a valence electron controlled impurity region such as a source or drain region.

A laser beam 105 is scanned in one direction relative to the semiconductor region 103 and facilitates the semiconductor region to crystallize. Alternatively, in parallel with the firstly scanned direction, a reciprocating scanning may be carried out. An applicable laser beam is a second harmonic of a laser beam radiated from a laser oscillator that uses a crystal in which Nd, Tm or Ho is doped in a crystal such as YAG, $YVO_4$, YLF, or $YAlO_3$. When Nd is used as a dopant, a wavelength of 532 nm can be obtained. It is of course that the wavelength, without restricting to this value, can be determined in consideration of the absorption coefficient of the material that forms the first semiconductor region.

In the case of silicon that is selected as the most suitable material, a region whose absorption coefficient is in the range of from $10^3$ to $10^4$ cm$^{-1}$ is substantially in the visible light region. In the case of a substrate high in visible light transmittance such as glass or the like and a first semiconductor region formed of silicon having a thickness in the range of 30 to 200 nm being combined, when a light in the visible light region having a wavelength of 400 to 700 nm is irradiated, the semiconductor region can be selectively heated.

Specifically, since a penetrating depth of a 532 nm wavelength light into the first semiconductor region 103 formed of an amorphous silicon film is substantially in the range of 100 nm to 1000 nm, the 532 nm light can sufficiently reach the inside of the first semiconductor region formed with a thickness of 30 to 200 nm. That is, the semiconductor film can be heated from the inside thereof, and a substantial entirety of the semiconductor film in a region irradiated by the laser beam can be uniformly heated.

The laser beam may be irradiated either, as shown in FIG. 1A, from a side where the first semiconductor region 103 is formed on the substrate 101, or, in the case of a substrate made of glass or quartz being applied, from the substrate 101 side. Furthermore, a shape of the laser beam at an irradiated surface may not be particularly restricted to an ellipse, a rectangle or the like, but is preferable to be longer than a length of one side of the first semiconductor region 103 formed divided into islands.

When the amorphous semiconductor film is crystallized, because of the densification resulting from liberation of contained hydrogen or rearrangement of atoms, a volume contraction is caused. Accordingly, at a boundary between the amorphous region and the crystalline region, lattice continuity cannot be secured, resulting in an occurrence of distortion. The reason for the active layer 104 of the TFT being formed, as shown in FIG. 1A, inside of a crystallized region 106 of the first semiconductor region 103 is to remove the distorted region.

Furthermore, since the crystal growth starts arbitrarily from an outer periphery of the first semiconductor region 103 and this region is rapidly cooled after the irradiation of the laser beam, there are formed a lot of fine crystal grains. The active layer 104 of the TFT being formed inside of the crystallized region 106 of the first semiconductor region 103 is significant also from this point.

A shape of the first semiconductor region 103 shown in FIG. 1A is characteristic in that at a corner portion thereof a seed region 107 is disposed, and when the laser beam irradiation is started from this portion, a semiconductor region having a single crystal orientation can be formed. The crystal growth starts based on a crystal first formed in the seed region 107, or based on a crystal formed beforehand. The crystal in the seed region is called a seed crystal, and for the seed crystal, an accidentally formed crystal may be used, or a crystal whose crystal orientation is intentionally determined by adding a catalyst element or a particular element can be applied.

The crystallization of the amorphous semiconductor film by use of a catalyst element is adequate in that a crystalline semiconductor film having a relatively high degree of orientation can be obtained. As the applicable catalyst elements, one kind or a plurality of kinds selected from Fe, Co, Ni, Ru, Rh, Pd, Os, Ir, Pt, Cu and Au can be used. The amorphous semiconductor film is formed with a thickness in the range of 10 nm to 200 nm.

Furthermore, as one suitable for the particular element, there is germanium that can generate a crystalline semiconductor film high in the degree of orientation in {101} plane. A concentration of germanium necessary to develop such an action, according to experimental results, may be 0.1 atomic percent or more and 10 atomic percent or less relative to silicon, being preferable to be 1 atomic percent or more and 5 atomic percent or less. When an amorphous silicon film is heated with the metal element added, a compound between silicon and the metal element (silicide) is formed and when the compound diffuses the crystallization proceeds. Germanium added to the amorphous silicon film does not react with the compound and remains in the surroundings thereof, resulting in causing local distortion. The distortion works in a direction to make a critical radius of nucleus generation larger, reduces the nucleus generation density, and has an effect of limiting the orientation of the crystal.

FIG. 2 shows a process by which a crystal grows from the seed region 107. The laser beam 105 is irradiated at the seed region 107 disposed at one end of the first semiconductor region 103 and scanned therefrom, while melting the semiconductor, toward the other end thereof, and thereby along in this direction the crystal can be grown. At this time, when the laser beam is a continuous wave and a melt region is held stationary, a continuous crystal can be grown. It is of course that a grown crystal has a single crystal orientation. Although the crystal that develops in the seed region 107 may be accidental one, when the catalyst element such as Ni is added, a crystal oriented in a {101} plane can be obtained with a higher probability. Furthermore, when germanium is added, the probability thereof is further improved.

As a shape capable of further improving a selectivity of the crystal in the seed region, as shown in FIG. 3, the seed region 107 may be formed into a shape projected from the first semiconductor region 103. When a width of the projected portion is set in the range of 1 to 5 μm, a plurality of crystal grains can be hindered from spontaneously occurring.

Furthermore, a mode shown in FIG. 4 shows a shape suitable for the case when before the formation of the first semiconductor region 103 the seed region 107 is formed, a selection region 110 being disposed to select one growing crystal orientation from the seed region 107 and to connect it to the first semiconductor region 103. The seed region 107 in this case is formed of a semiconductor formed in a layer separate from the first semiconductor region 103, a crystalline semiconductor film crystallized by adding the catalyst element, or a crystalline semiconductor film crystallized by adding the catalyst element to the amorphous semiconductor film formed of germanium added silicon being applicable. Since these crystalline semiconductor films are high in the degree of orientation, the use of these allows forming a crystalline semiconductor film having the same crystal orientation with excellent reproducibility.

An entirety of the first semiconductor region 103 is crystallized by the irradiation of the continuous wave laser beam. Thereafter, it is preferable to apply the gettering process. When the continuous wave laser beam is irradiated, the semiconductor becomes a molten state and a necessary time depends also on a scanning speed of the beam. A scanning speed of approximately 1 to 100 cm/sec is applied. However, it is difficult to completely suppress the foreign impurities from being mixed in. As unfavorable impurities, though there are also air components such as oxygen, nitrogen and carbon, other than the above, there are metal impurities resulting from constituent members of apparatus such as Fe, Ni, and Cr.

For the gettering, an amorphous semiconductor film that comes in contact with the first semiconductor region and forms a distortion field is formed followed by heating, and thereby an impurity portion is allowed to segregate. As a semiconductor film in which the distortion field is formed, an amorphous semiconductor film therein phosphorus is added and an amorphous semiconductor film therein a periodic table 18th group element such as argon and so on is added are suitable. A heating temperature is in the range of 500 to 800 degree centigrade and the heating process is carried out with a annealing furnace, a rapid thermal annealing (RTA) furnace and so on. At this time, the laser beam may be irradiated to promote a reaction.

Thereafter, as shown in FIG. 1B, an active layer 104 is formed by etching. Thereafter, as shown in FIG. 1C, a gate insulating film 108 and a gate electrode 109 are formed, in addition, a source region and a drain region are formed in the semiconductor region followed by disposing necessary interconnections, and thereby a TFT can be formed. As obvious from the comparison between FIG. 1C and FIG. 1A, a channel length direction of a completed TFT and a scanning direction of the laser beam are made in the same direction.

In a method for irradiating the laser beam like this, when the continuous wave laser beam is irradiated, crystals having larger grain sizes are allowed growing in the scanning direction thereof. It is of course necessary to appropriately set details of parameters such as the scanning speed and an energy density of the laser beam. However, when the scanning speed is set in the range of 10 to 100 cm/sec, the above crystal growth can be realized. It is said that a crystal growth speed is 1 m/sec when the crystal is grown through melting/solidifying with the pulse laser. However, when the laser beam is scanned at a slower speed than the above followed by slowly cooling, a continuous crystal growth in a solid-liquid interface can be attained, resulting in realizing larger diameter crystals. The laser beam may be scanned not only in one direction, but also in a reciprocating way.

An example of a laser processor that makes such the processing possible is a configuration shown in FIGS. 5 and 6. The laser processor allows the laser beam to irradiate an arbitrarily assigned position on a substrate and crystallize it. When a plurality of laser beams is irradiated from a plurality of directions, the throughput can be further improved. Still furthermore, the laser processor is configured so that the plurality of the laser beams may be superposed in an irradiated surface, and thereby the energy density necessary for the laser processing may be obtained, and the interference of lights may be removed.

FIG. 5 is a top view showing a configuration of such a laser processor. FIG. 6 is a corresponding sectional view thereof. The following explanation will be given with reference to both FIGS. 5 and 6. Furthermore, in FIGS. 5 and 6, for convenience of explanation, common reference numerals are used.

A first optical system 401 includes a laser oscillator 301a, a group of lenses 302a, a first galvanometer mirror 303a, a second galvanometer mirror 304a, and an f-theta lens 305a. Here, the first galvanometer mirror 303a and the second galvanometer mirror 304a are disposed as deflection means.

A second optical system 402 and a third optical system 403 are similarly configured. A deflection direction of the laser beam is controlled with rotation angles of a first galvanometer mirror 303b and a second galvanometer mirror 304b, or a first galvanometer mirror 303c and a second galvanometer mirror 304c, and thereby the laser beam is irradiated onto a subject being processed 307 on a susceptor 306. A beam shape can be formed into an arbitrary one with each of the lens groups 302a through 302c and, if necessary, a slit, and may be formed into a circle, an ellipse, or a rectangle of substantially several tens µm to several hundreds µm. The susceptor 306, being fixed in this case, however, since it can be synchronized with the scanning of the laser beam, may be made movable in X, Y and theta directions.

Then, when the laser beams irradiated from the first through third optical systems on the subject being processed are superposed with each other, an energy density necessary for the laser processing can be obtained and the interference of lights can be removed. Since each of the laser beams radiated from the different laser oscillators is different in its phase from the others, when these are superposed, the interference can be reduced.

A configuration in which three laser beams radiated from the first through third optical systems are superposed is shown in the above. However, a similar effect is not restricted to the number thereof, and in order to attain the intention, a plurality of laser beams need only be superposed. Furthermore, when the similar effect can be obtained, the configuration of the laser processor is not restricted to one shown in FIGS. 5 and 6.

Furthermore, as another configuration of the laser processor, apparatus having a configuration shown in FIG. 23 can be applied. The configuration of FIG. 23 illustrates apparatus that includes a laser oscillator 2301, a beam expander 2302, a mirror 2303, a cylindrical lens 2304, a convex lens 2305 and a susceptor 2307. In the optical system, a diameter of a beam radiated from the laser oscillator 2301 is expanded by use of the beam expander 2302, and a shape of the beam is formed into an ellipse by use of the cylindrical lens 2304. Furthermore, in order to obtain an energy density necessary for the laser annealing, the convex lens 2305 is disposed to converge. Thus, when the laser beam is formed into an ellipse, an irradiating area can be made larger.

Still furthermore, in this apparatus, by moving the susceptor 2307 in one direction or two directions by use of a movement means, a substrate 2306 can be laser-annealed. It is configured so that when an angle of incidence of the laser beam is set at a particular angle, a laser beam reflected from the substrate 2306 (return beam) may be hindered from entering again into the optical system.

When with the laser processor thus configured, as explained with reference to FIG. 1, the scanning direction of the laser beam is allowed substantially coinciding with the channel length direction in the TFT, the crystal orientation becomes a single orientation, resulting in an improvement in the field-effect mobility. Furthermore, when a seed crystal whose crystal plane is controlled is disposed in the seed region, an active layer having a single orientation can be formed. In a top gate type TFT, a film quality of a gate insulating film formed thereon becomes hardly fluctuating, resulting in realizing a decrease in the fluctuation of a threshold voltage. It is of course that the present invention can be applied to a bottom gate type (or it is called also an inverse staggered type) TFT.

EMBODIMENTS

In the following, with embodiments, specific examples of methods for fabricating semiconductor devices according to the present invention will be detailed with reference to the drawings.

[Embodiment 1]

In the present embodiment, an amorphous silicon film formed on an insulating surface is etched into a predetermined pattern by use of photo-etching, and thereby a first semiconductor region is formed. The obtained first semiconductor region is crystallized with the laser beam.

In FIGS. 7A and 7B, a barrier layer 402 made of a silicon oxynitride film having a thickness of 100 nm is formed on a glass substrate 401. A first semiconductor region 403 thereon is an amorphous silicon film having a thickness of 100 nm and formed by use of the plasma CVD method. In FIGS. 7A and 7B, 7A is a top view of the first semiconductor region 403 and 7B is a diagram showing a sectional structure including the substrate 401. Though not yet embodied in this stage, dotted lines show positions where active layers 405a and 405b of a TFT are formed within the first semiconductor region 403 but not extending to end portions thereof.

A seed region 404 is formed at one end in a longer direction in the first semiconductor region 403. In the case of the present embodiment, it is intended that a crystal orientation that is developed in this region by the irradiation of the laser beam becomes a crystal orientation of the first semiconductor region 403.

FIGS. 8A and 8B are diagrams showing stages of crystallization due to a continuous wave laser beam. Though an irradiating area of a laser beam 406 may be smaller than that in the first semiconductor region, the laser beam is irradiated so that a longer direction thereof may intersect with a shorter direction of the first semiconductor region. Though a shape of the beam may be formed into an arbitrary one of such as a rectangular, linear, and elliptic one, anyway, the laser beam is irradiated as shown in FIGS. 8A and 8B so that the crystallization may proceed from one end of the first semiconductor region 403 to the other end thereof. When such the laser beam is irradiated, the laser processor having a configuration shown in FIGS. 5 and 6, or the laser processor having a configuration shown in FIG. 23 can be applied. In the laser beam converged with the optical system, the energy intensity is not necessarily the same at a center portion and an end portion thereof, accordingly, it is preferable for the first semiconductor region 403 not to overlap with an end portion of the beam.

When a continuous wave $YVO_4$ laser having an output of 10 W is used, a laser light is modulated into a higher harmonics with a nonlinear optical element. Furthermore, there is a method in which an $YVO_4$ crystal and a nonlinear optical element are together put into a resonator, and thereby higher harmonics are emitted. It is preferable for a laser light to be formed into a rectangular shape or an elliptic shape at an irradiated surface by use of the optical system followed by irradiating a subject being processed. A substantially 0.01 to 100 $MW/cm^2$ (being preferable to be 0.1 to 10 $MW/cm^2$) of energy density is necessary at that time. The laser beam scans a surface being irradiated at a scanning speed in the range of 0.5 to 2000 cm/sec.

Thus, the crystallization starts from a region where the laser beam 406 is irradiated, and thereby a crystalline semiconductor 407 can be obtained.

Thereafter, as shown in FIGS. 9A and 9B, the crystallized first semiconductor region 403 is photo-etched into a predetermined pattern that becomes active layers 405a and 405b. In order to form a top gate type TFT, on each of the active layers 405a and 405b, a gate insulating film, a gate electrode, and a one-conductivity type impurity region are formed, and thereby a TFT is formed. Furthermore, if necessary, interconnections and interlayer insulating films may be formed.

A configuration of an active matrix type display device that uses TFTs can be divided, from its functions, into a pixel portion and a driver portion. In a TFT that uses the active layer formed according to the present embodiment, the pixel portion and the driver portion can be integrally formed on the same substrate. FIG. 25 including enlarged views 1304, 1305 and 1306 shows in detail relationship between a TFT panel 1201 formed on a mother glass 1200 and an irradiation direction of the laser beam. In the TFT panel 1201, regions where pixel portions 1202 and driver portions 1203 and 1204 are formed are shown with dotted lines. The first semiconductor region is formed in each of the regions, and a method for forming each of the active layers in this state is shown in each of enlarged views 1304, 1305 and 1306 in FIG. 25.

For instance, the driver portion 1203 is a region for forming a scanning line driver, and an enlarged view 1305 thereof shows a state where a first semiconductor region 1251 thereon an active layer 1258 is formed is formed. The disposition of the first semiconductor region 1251 allows scanning a continuous wave laser beam 1405 in a direction shown with an arrow mark. A shape of the active layer 1258 can be formed into an arbitrary one, however, a channel length direction and a laser beam scanning direction are aligned.

Furthermore, the driver portion 1204 extended in a direction that intersects with the driver portion 1203 is a region for forming a data line driver, therein a first semiconductor region 1250 being formed, an active layer 1257 formed therefrom being allowed coinciding with a scanning direction of a laser beam 1404 (enlarged view 1304). Furthermore, the pixel portion 1202 is similarly configured. As shown in the enlarged view 1306, a first semiconductor region 1252 is formed, an active layer 1259 formed therefrom being allowed coinciding with a scanning direction of a laser beam 1406. Since because of this arrangement, the laser beams all need only be scanned in the same direction, a processing time can be more shortened.

In a method for irradiating the laser beam like this, when the continuous wave laser beam is irradiated, the crystal growth that has a single orientation and in which crystal grains extend in a scanning direction of the laser beam can be realized. It is of course that details of parameters such as the scanning speed and the energy density of the laser beam have to be appropriately set, however, when the scanning speed is set in the range of 10 to 100 cm/sec, the above crystal growth can be realized. It is said that a crystal growth speed is 1 m/sec when a melting/solidifying process is carried out with the pulse laser. However, when the laser beam is scanned at a slower speed than the above followed by slowly cooling, a continuous crystal growth in a solid-liquid interface can be attained, resulting in realizing larger diameter crystals.

[Embodiment 2]

In Embodiment 1, the laser beam may be scanned not only in one direction but also in a reciprocating way. FIGS. 10A and 10B show a mode thereof, and in this case, seed regions 404a and 404b may be disposed at both ends of the first semiconductor region 403. When the reciprocating scanning is carried out, for each scanning, the energy density of the laser beam may be changed, and thereby a step-wise crystal growth can be realized. Furthermore, in the case of an amorphous silicon film being crystallized, a hydrogen expelling process that becomes frequently necessary can be concurrently performed. That is, after the laser beam is scanned at a lower energy density and thereby hydrogen is expelled, the energy density is raised followed by the second scanning, and thereby the crystallization may be completed. According to also such a fabricating method, similarly, the crystalline semiconductor film in which crystal grains extend in a scanning direction of the laser beam can be obtained.

[Embodiment 3]

The present embodiment has an intention in that an amorphous silicon film formed on an insulating surface is crystallized in advance, and a further larger crystal is formed with the continuous wave laser beam.

As shown in FIG. 11A, similarly to embodiment 1, a blocking layer 502 and an amorphous silicon film 503 are sequentially formed on a glass substrate 501. Thereon, a 100 nm thick silicon oxide film is formed as a mask insulating film 504 by means of the plasma CVD method followed by disposing an opening 505. Thereafter, in order to add Ni as the catalyst element, an aqueous solution containing 5 ppm of nickel acetate is spin-coated, and thereby a catalyst element-containing layer 506 is formed. The Ni that is the catalyst element comes into contact with the amorphous silicon film at the opening 505. The opening 505 is formed in a seed region of the first semiconductor region that is formed later or at a position outside thereof.

Thereafter, as shown in FIG. 11B, the amorphous silicon film is heated at a temperature of 580 degree centigrade for 4 hr and is crystallized. The crystallization, owing to an action of the catalyst element, proceeds from the opening 505 to a direction in parallel with a substrate surface. Thus formed crystalline silicon film 507 is an aggregate of rod-like or needle-like crystals. Since, macroscopically, each of the crystals is grown with a particular orientation, a uniform crystallinity can be obtained. Furthermore, the degree of orientation in a particular direction is high.

When the heating process is completed, the mask insulating film 504 is etched out, and thereby the crystalline silicon film 507 as shown in FIG. 11C can be obtained.

Thereafter, as shown in FIGS. 12A and 12B, the crystalline silicon film 507 is etched into a predetermined pattern by use of the photoetching method, and thereby a first semiconductor region 508 is formed. Regions where the active layers 510a and 510b of the TFT are formed are located within the first semiconductor region 508 and as shown in FIG. 12A a continuous wave laser beam 509 is scanned in one direction. Alternatively, the laser beam may be scanned in a reciprocating way.

When such the laser beam is irradiated, a crystalline silicon film is melted and recrystallized. Accompanying this recrystallization, the crystal growth in which crystal grains are formed elongated in a scanning direction of the laser beam is accomplished. In this case, since the crystalline silicon film whose crystal plane is aligned is formed in advance, precipitation of crystals having different planes or occurrence of dislocations can be hindered from occurring. Subsequently, according to the processing similar to embodiment 1, a TFT can be formed.

[Embodiment 4]

Similarly to Embodiment 3, after on the glass substrate 501, the blocking layer 502 and the amorphous silicon film 503 are sequentially formed, Ni is added as the catalyst element on an entire surface thereof. A method for adding Ni is not restricted to a particular one, a spin coating method, a vapor deposition method, and a sputtering method can be applied. When the spin coating method is used, an aqueous solution containing 5 ppm of nickel acetate is coated, and thereby a catalyst-containing layer 506 is formed (FIG. 13A).

Thereafter, the amorphous silicon film 503 is heated at a temperature of 580 degree centigrade for 4 hr and is crystallized. Thus, as shown in FIG. 13B, a crystalline silicon film 507' can be obtained. The crystalline silicon film 507' is also an aggregate of rod-like or needle-like crystals. Since, macroscopically, each of the crystals is grown with a particular orientation, a uniform crystallinity is secured. Furthermore, the degree of orientation in a particular direction is high. Subsequent processes can be performed similarly to Embodiment 3.

[Embodiment 5]

In Embodiment 3 or Embodiment 4, after the crystalline silicon film 507 is formed, a process due to the gettering for removing the catalyst element remaining in the film at a concentration of $10^{19}/cm^3$ or more may be added.

As shown in FIG. 14, on the crystalline silicon film 507, a barrier layer 511 made of a thin silicon oxide film is formed, and thereon an amorphous silicon film therein argon is added in the range of $1 \times 10^{20}/cm^3$ to $1 \times 10^{21}/cm^3$ as gettering sites 512 is formed.

Thereafter, furnace annealing at a temperature of 600 degree centigrade for 12 hr, or lamp annealing or gas annealing at a temperature in the range of 650 to 750 degree centigrade for 30 to 60 minutes is performed, and thereby Ni added as the catalyst element is allowed segregating at the gettering sites 512. As a result of this process, a concentration of the catalyst element in the crystalline silicon film 507 can be reduced to $10^{17}/cm^3$ or less.

After the gettering process is over, similarly to Embodiment 3 or Embodiment 4, the subsequent process can be forwarded.

[Embodiment 6]

When a crystalline semiconductor film whose crystal orientation is determined is previously formed in the seed region, the crystal orientation in the first semiconductor region can be aligned. First, as shown in FIG. 15A, a blocking layer 602 is formed on a glass substrate 601, and thereon an amorphous silicon film 603 is formed. The amorphous silicon film 603, in view of the formation of the seed region after the crystallization, need not be formed so thick, and is formed with a thickness in the range of substantially 30 to 100 nm. Thereafter, a catalyst element-containing layer 604 is formed. This formation method needs only be carried out similarly to Embodiment 3 or Embodiment 4.

Thereafter, the heating process is performed to crystallize, and thereby a crystalline silicon film 605 is obtained (FIG. 15B). In this stage, similarly to Embodiment 5, the gettering process may be implemented. The crystalline silicon film 605 is photo-etched into a predetermined pattern, and thereby a seed crystal 606 located in the seed region as shown in FIG. 15C is formed. Thereafter, on an entire surface of the glass substrate 601 an amorphous silicon film 607 is formed at a thickness of 150 nm.

Subsequently, as shown in FIGS. 16A and 16B, the amorphous silicon film 607 is photo-etched into a predetermined pattern, and thereby a first semiconductor region 608 is formed. At end portions of the first semiconductor region 607, seed region 609 is formed, and in the region the seed crystals 606 are disposed on the blocking layer. Regions where active layers 610a and 610b shown with dotted lines are formed are disposed so as to be within the first semiconductor region 608.

Thereafter, as shown in FIGS. 17A and 17B, a continuous wave laser beam 611 is scanned from one end of the first semiconductor region toward the other end thereof, and thereby the first semiconductor region is crystallized. When the continuous wave laser beam 611 is scanned from the seed region 609, a crystalline region 612 can be formed so as to have a crystal orientation the same as that of the seed crystal 606.

Thereafter, as shown in FIGS. 18A and 18B, the crystallized first semiconductor region 608 is photo-etched into a predetermined pattern into which active layers 610a and 510b are formed. When a top gate type TFT is formed, on each of the active layers 610a and 610b a gate insulating film, a gate electrode and a one-conductivity type impurity region are formed, and thereby a TFT can be formed. Thereafter, as needs arise, interconnections and interlayer insulating films can be formed.

[Embodiment 7]

In Embodiment 6, the seed crystal 606 can be formed from a crystalline germanium-containing silicon film. This can be formed when, in FIG. 15A, in place of the amorphous silicon film, an amorphous silicon film containing 0.1 to 10 atomic percent, preferably 1 to 5 atomic percent of germanium is formed, and the others are similarly performed.

An advantageous point in the use of the germanium-containing crystalline silicon film is in that the degree of orientation is high, that is, that in a {101} plane can be increased to 40 to 90%. When a seed crystal is formed from such the crystalline silicon film, the degree of orientation in the first semiconductor region, that is, in the active layer can be heightened.

[Embodiment 8]

The present invention can be applied also to a process for fabricating a bottom gate type TFT in which a gate electrode is disposed between a substrate and a semiconductor film. As shown in FIGS. 24A and 24B, a gate electrode 202 made of Mo or Cr is formed on a substrate 201 followed by the formation of a gate insulating film 203 that is formed by depositing a silicon nitride film and a silicon oxide film. Thereon, a first semiconductor region 204 formed of an amorphous silicon film is formed. When a laser beam 210 is irradiated, a crystallized region 205 can be formed.

After the first semiconductor region is crystallized, an active layer 206 is formed therefrom, and when source and drain regions are formed according to the known method, a bottom gate type TFT can be formed. The formation of the first semiconductor region in the present embodiment can be carried out according to any one of combinations of methods according to Embodiments 1 through 8.

[Embodiment 9]

According to any one of Embodiments 1 through 8, to the first semiconductor region crystallized with the continuous wave laser beam, the gettering process explained in Embodiment 5 can be applied. The method for gettering can be carried out similarly to Embodiment 5. When the gettering process is applied, the metal impurities that come in at the crystallization and are allowed to segregate thereafter can be removed.

[Embodiment 10]

In the present Embodiment, one example in which with one of the crystalline silicon films fabricated according to Embodiments 1 through 7, a CMOS type TFT is fabricated will be explained with reference to FIGS. 19A through 19C.

FIG. 19A shows a state where on a surface of a blocking layer 702 formed on a glass substrate 701, active layers 703a and 703b, a gate insulating film 704 and gate electrodes 705a and 705b are formed. The active layers 703a and 703b are prepared with one of the crystalline silicon films fabricated according to Embodiments 1 through 7. The gate insulating film 704 is a silicon oxynitride film having a thickness of 80 μm that is formed from reaction gases SiH$_4$, N$_2$O and O$_2$ by use of the plasma CVD method. Since the active layers 703a and 703b are high in the degree of crystal orientation, quality of the gate insulating film formed thereon can be suppressed from fluctuating, resulting in reducing fluctuation of a threshold voltage of the TFT. Furthermore, as materials for forming the gate electrode, conductive materials such as Al, Ta, Ti, W and Mo or alloys thereof can be applied, a thickness thereof being 400 nm. With Al as the gate electrode, a surface thereof may be stabilized by forming an oxide film according to anodizing.

FIG. 19B is a diagram showing a stage where the impurity regions are formed. That is, a source or drain region 706 and an LDD region 707 for an n-channel type TFT, and a source or drain region 708 for a p-channel type TFT are formed according to the ion doping method.

In a region where an impurity element is injected by use of an ion doping method, the crystallinity thereof is destroyed, resulting in an amorphous state. In order to recover the crystallinity and to activate the impurity to make resistance lower, the laser processing is carried out. The laser processing can be carried out by use of the laser processor according to the present invention. Furthermore, when the laser irradiation is performed in a hydrogen atmosphere (reducing atmosphere), hydrogenation can be simultaneously performed.

Thereafter, as shown in FIG. 19C, an interlayer insulating film 710 is formed with a silicon nitride film or silicon oxide film. Subsequently, contact holes are formed so as to reach impurity regions of the respective semiconductor layers and interconnections 712 and 713 are formed with Al, Ti or Ta. Furthermore, a passivation film 711 is formed of a silicon nitride film.

Thus, an n-channel type TFT and a p-channel type TFT can be formed. Although each of the TFTs is shown as a single body here, with these TFTs a CMOS circuit, a NMOS circuit or a PMOS circuit may be formed. Since in the active layer that is formed according to the present invention, the crystal growth is advanced in a direction in parallel with a channel length direction, there is substantially no grain boundary that carriers traverse, resulting in obtaining high field-effect mobility. Thus fabricated TFTs can be used as TFTs for fabricating active-matrix type liquid crystal displays and display devices having a light-emitting element, or TFTs for forming a memory and a microprocessor on a glass substrate.

[Embodiment 11]

An example of a configuration of a TFT substrate (a substrate thereon a TFT is formed) for realizing an active matrix drive type display device with a TFT fabricated similarly to Embodiment 10 will be explained with reference to FIG. 20. In FIG. 20, a driver portion 806 having an n-channel TFT 801, a p-channel TFT 802 and an n-channel TFT 803, and a pixel portion 807 having an n-channel TFT 804 and a capacitor 805 are formed on the same substrate.

The n-channel type TFT 801 of the driver portion 806 includes a channel formation region 862, a second impurity region 863 partially overlapped with a gate electrode 810, and a first impurity region 864 that works as a source region or a drain region. The p-channel type TFT 802 includes a channel formation region 865, a fourth impurity region 866 partially overlapped with a gate electrode 811, and a third impurity region 867 that works as a source region or a drain region. The n-channel type TFT 803 includes a channel formation region 868, a second impurity region 869 partially overlapped with a gate electrode 812, and a first impurity region 870 that works as a source region or a drain region. With the n-channel type TFT and p-channel type TFT like this, a shift resistor circuit, a buffer circuit, a level shifter circuit and latch circuit can be formed.

An active layer where these channel formation regions and impurity regions are formed can be formed similarly to Embodiments 1 through 7. When the active layer is crystal-grown in a channel length direction in parallel with the substrate, a probability that carriers traverse grain boundaries becomes very low. Thereby, higher field-effect mobility can be obtained, resulting in extremely excellent characteristics.

The pixel TFT 804 of the pixel portion 807 includes a channel formation region 871, a second impurity region 872 formed outside of a gate electrode 813, and a first impurity region 873 that works as a source region or a drain region. Furthermore, in a semiconductor film that works as one electrode of the capacitor 805 a third impurity region 876 thereto boron is added is formed. The capacitor 805 is formed of an electrode 814 and a semiconductor film 806 with an insulating film (the same film with the gate insulating film) interposed therebetween as dielectrics. Reference numerals 853 to 860 denote various kinds of interconnections, and reference numeral 861 corresponds to a pixel electrode.

Since these TFTs are high in the degree of orientation of the active layer thereon the channel formation region and the impurity region are formed and flat, the film quality of the gate insulating film that is formed thereon can be suppressed from fluctuating. Accordingly, the threshold voltages of the TFTs are suppressed from fluctuating. As a result, the TFT can be driven at a lower voltage, resulting in smaller power consumption. Furthermore, since a surface thereof is planarized, an electric field does not concentrate at projections, accordingly a hot-carrier effect occurring particularly at a drain edge can be hindered from causing deterioration. Still furthermore, although a concentration distribution of carriers that flow between the source and the drain becomes high in the neighborhood of the boundary with the gate insulating film, because of the planarization, the carriers, without being disturbed, can move smoothly, resulting in an improvement of the field-effect mobility.

In order to fabricate a liquid crystal display device from such the TFT substrate, an opposite substrate thereon a common electrode is formed is disposed with a spacing of substantially 3 to 8 µm, and therebetween an orientation film and a liquid crystal layer in contact therewith need only be formed. Known techniques can be applied to these.

FIG. 21 shows a circuit configuration of such an active matrix substrate. A driver portion for driving TFTs 900 of a pixel portion 901 includes a data line drive circuit 902 and a scanning line drive circuit 903, and, as needs arise, may be formed with a shift resistor circuit, a buffer circuit, a level shifter circuit, and a latch circuit. In this case, the scanning line drive circuit 903 receives image signals from a controller 904 and timing signals for use in driving a scanning line from a timing generator 907, and sends out image signals. The data line drive circuit 902 receives timing signals for use in data line drive from the timing generator 907 and outputs signals to the scanning line. A microprocessor 906 controls the controller 904, writes data such as image signals into a memory 905, inputs from and outputs to an outside interface 908, and manages operations of the entire system.

The TFTs for configuring these circuits can be formed from the TFTs having one of configurations shown in the present embodiments. When the active layer that forms the channel formation region of the TFT is made a region that can be considered a substantial single crystal, characteristics of the TFT can be improved and various functional circuits can be formed on the substrate such as glass.

[Embodiment 12]

As another example using a TFT substrate, an example of a display device using a light emitting element will be described with reference to the drawings. FIGS. 20A and 20B are cross-sectional views showing a pixel structure of a display device formed by placing a TFT for each pixel. Since n-channel TFTs 2100 and 2102 and a p-channel TFT 2101 shown in FIG. 20 have the same structures as in Embodiment 10, the detailed description thereof is omitted in Embodiment 12.

FIG. 20A shows the structure in which the n-channel TFT 2100 and the p-channel TFT 2101 are formed at a pixel on a substrate 2001 through a blocking layer 2002. In this case, the n-channel TFT 2100 is a TFT for switching whereas the p-channel TFT 2101 is a TFT for current control. A drain side of the p-channel TFT 2101 is connected to one of the electrodes of a light emitting element 2105. The p-channel TFT 2101 is intended for the operation for controlling a current flowing toward the light emitting element 2105. Certainly, the number of TFTs provided at one pixel is not limited; it is possible to provide an appropriate circuit structure in accordance with a driving method of a display device.

The light emitting element 2105 shown in FIG. 20A includes an anode layer 2011, an organic compound layer 2012 containing a light emitter, and a cathode layer 2013. A passivation layer 2014 is formed thereon. The organic compound layer includes: a light emitting layer; a hole injection layer: an electron injection layer: a hole transport layer; an electron transport layer and the like. The luminescence generated from the organic compound includes light emission (fluorescence) caused upon transition from a singlet excited state to a ground state and light emission (phosphorescence) caused upon transition from a triplet excited state to a ground state. The organic compound layer may be formed by a dispersion of the low molecular or the high molecular compound material, or a dispersion of an inorganic compound materials such as the low molecular or the high molecular compound material having a electron transporting property or a hole transporting property.

As a material for forming the anode, a material having a high work function such as indium oxide, tin oxide or zinc oxide is used. As a material for the cathode, a material having a low work function, i.e., alkaline metals or alkaline earth metals such as MgAg, AlMg, Ca, Mg, Li, AlLi, and AlLiAg, typically a material made of a magnesium compound, is used. Alternatively, the cathode may be formed by the combination of a thin lithium fluoride layer having a thickness of 1 to 20 nm and an Al layer, or the combination of a thin cesium layer and an Al layer. The anode is connected to a drain side wiring 2010 of the p-channel TFT 2101. A barrier layer 2003 is formed so as to cover the ends of the anode 2011.

The passivation layer 2014 is formed on the light emitting element 2105. A material having high barrier effects against oxygen or moisture, such as silicon nitride, silicon oxynitride or diamond like carbon (DLC), is used to form the passivation layer 2014. With such a structure, light emitted from the light emitting element is radiated from the anode side.

On the other hand, FIG. 20B shows the structure where the n-channel TFT 2100 and the n-channel TFT 2102 are formed at a pixel on the substrate 2001 through the blocking layer 2002. In this case, the n-channel TFT 2100 is a TFT for switching whereas the n-channel TFT 2102 is a TFT for current control. A drain side of the n-channel TFT 2102 is connected to one of the electrodes of a light emitting element 2106.

The light emitting element 2106 includes a film made of a material having a high work function such as indium oxide, tin oxide or zinc oxide as an anode layer 2016, on a wiring 2015 to be connected to the drain side of the n-channel TFT 2102.

The structure of a cathode formed on an organic compound layer 2018 includes a first cathode layer 2019 having a thickness of 1 to 2 nm, formed of a material having a low work function, and a second cathode layer 2017 formed on the first cathode layer 2019, which is provided so as to lower the resistance of the cathode. The first cathode layer 2019 is made of cesium, an alloy of cesium and silver, lithium fluoride, alkaline metals or alkaline earth metals such as MgAg, AlMg, Ca, Mg, Li, AlLi, AlLiAg and the like, typically, a magnesium compound. The second cathode layer 2017 is formed of a metal material such as Al or Ag to have a thickness of 10 to 20 nm, or a transparent conductive film such as indium oxide, tin oxide or zinc oxide to have a thickness of 10 to 100 nm. A passivation film 2020 is formed on the light emitting element 2106. With such a structure, light emitted from the light emitting element is radiated from the cathode side.

As another form of the light emitting element 2106 shown in FIG. 22B, a cathode layer 2016 made of cesium, an alloy of cesium and silver, lithium fluoride, alkaline metals or alkaline earth metals such as MgAg, AlMg, Ca, Mg, Li, AlLi, AlLiAg and the like, typically, a magnesium compound as a cathode material, an organic compound layer 2018, a thin first anode layer 2019 having a thickness of about 1 to 2 nm, and a second anode layer 2017 made of a transparent electrically conductive film may be formed on the wiring 2015 connected to the drain side of the n-channel TFT 2102. The first anode layer 2019 is formed of a material having a high work function such as nickel, platinum or lead by vapor deposition.

In the above-described manner, a display device using an active matrix driving light emitting element can be manufactured. These TFTs include an active layer for forming channel formation regions and impurity regions, which has a high orientation rate and is leveled. Therefore, unevenness of the film quality of the gate insulating film formed on the active layer can be reduced. Accordingly, variation in threshold voltage of a TFT can be reduced. As a result, TFTs can be driven at a low voltage, providing an advantage that power consumption is reduced. Since the TFT for current control connected to the light emitting element is required to have a high current driving capability in this display device, the TFT in this embodiment is suitable for such application. Although not shown herein, the structure in which driver circuit potions are provided in the periphery of a pixel portion, may be the same as in Embodiment 5.

[Embodiment 13]

The present invention can be utilized for various semiconductor devices. Following can be given as such semiconductor devices: a portable information terminal (electronic notebook, mobile computer, portable phone and the like), a video camera, a digital camera, a personal computer, a TV image receiver, a portable phone, a projection display device and the like. Examples of these are shown in FIGS. 26A to 26G and FIGS. 27A to 27D.

FIG. 26A is an example of completing a TV image receiver by implementing this invention and it is composed of a frame 3001, a support stand 3002, a display portion 3003 and the like. The TFT substrate fabricated by this invention is applied in the display portion 3003, and the TV image receiver can be completed by applying the present invention.

FIG. 26B is an example of completing a video camera by implementing this invention and it is composed of a main body 3011, a display portion 3012, a voice input portion 3013, operation switches 3014, a battery 3015, an image receiving portion 3016 and the like. The TFT substrate fabricated by this invention is applied in the display portion 3012, and the video camera can be completed by applying the present invention.

FIG. 26C is an example of completing a lap-top computer by implementing this invention and it is composed of a main body 3021, a frame 3022, a display portion 3023, keyboard 3024 and the like. The TFT substrate fabricated by this invention is applied in the display portion 3023, and the personal computer can be completed by applying the present invention.

FIG. 26D is an example of completing a PDA (Personal Digital Assistant) by implementing this invention and it is composed of a main body 3031, a stylus 3032, a display portion 3033, operation buttons 3034, an external interface 3035 and the like. The TFT substrate fabricated by this invention is applied in the display portion 3033, the PDA can be completed by applying the present invention.

FIG. 26E is an example of completing a sound reproducing system, specifically an on-vehicle audio apparatus, by implementing this invention and it is composed of a main body 3041 a display portion 3042, operation switches 3043, 3044 and the like. The TFT substrate fabricated by this invention is applied in the display portion 3042, the audio device can be completed by applying the present invention.

FIG. 26F is an example of completing a digital camera by implementing this invention and it is composed of a main body 3051, a display portion (A) 3052, an eyepiece portion 3053, operation switches 3054, a display portion (B) 3055, a battery 3056 and the like. The TFT substrate fabricated by this invention is applied in the display portion (A) 3052 and the display portion (B) 3055, the digital camera can be completed by the present invention.

FIG. 26G is an example of completing a portable phone by implementing this invention and it is composed of a main body 3061, a voice output portion 3062, a voice input portion 3063, a display portion 3064, operation switches 3065, an antenna 3066 and the like. The TFT substrate fabricated by this invention is applied in the display portion 3064, the portable phone can be completed by applying the present invention.

FIG. 27A is a front type projector which comprises a projection system 2601, a screen 2602 and the like. FIG. 22B is a rear type projector which comprises a main body 2701, a projection system 2702, a mirror 2703, a screen 2704 and the like.

Besides, FIG. 27C is a diagram showing an example of a structure of projection systems 2601 and 2702 in the FIG. 27A and the FIG. 27B. Each of projection systems 2601 and 2702 comprises an optical light source system 2801, mirrors 2802 and 2804 to 2806, a dichroic mirror 2803, a prism 2807, a liquid crystal device 2808, a phase difference plate 2809, and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 27C.

FIG. 27D is a diagram showing an example of a structure of an optical light source system 2801 in FIG. 27C. In this embodiment, the optical light source system 2801 comprises a reflector 2811, a light source 2812, lens arrays 2813 and 2814, a polarizer conversion element 2815, and a condenser 2816. Note that the optical light source system shown in FIG. 27D is merely an example and the structure is not limited to this example. For instance, an operator may appropriately dispose an optical lens, a film which has a function to polarize light, a film which adjusts a phase difference or an IR film, etc.

FIG. 28 is an electronic book which comprises a main body 3101, a display portion A 3102, a display portion B 3103, a memory medium 3104, an operation switch 3105, an antenna 3106, and the like. The display portion B 3105 can be applied to en electronic ink display, and the TFT substrate fabricated by this invention can form the driver circuit of the display portion A 3102 and the display portion B 3103, and the pixel portion. By applying the present invention, the electronic book can be completed.

Besides, electronic devices shown here are merely examples and they are not limited these usages.

ADVANTAGE OF THE INVENTION

As explained above, according to the present invention, when a first semiconductor region is formed and a scanning direction of a continuous wave laser beam and a channel length direction in a TFT are allowed roughly coinciding, a crystal orientation becomes a single orientation and field-effect mobility can be improved. Furthermore, when a seed crystal whose crystal plane is controlled is disposed in a seed region, an active layer of a single orientation can be formed, accordingly, in a top gate type TFT, a film quality of a gate insulating film thereon formed can be suppressed from fluctuating, resulting in suppressing the threshold voltage from fluctuating.

BRIEF DESCRIPTION OF THE DRAWINGS

FIG. 6 is a layout drawing showing one mode of a laser irradiator being applied to the present invention.

FIG. 23 is a layout drawing showing one mode of a laser irradiator being applied to the present invention.

Figure 1A:
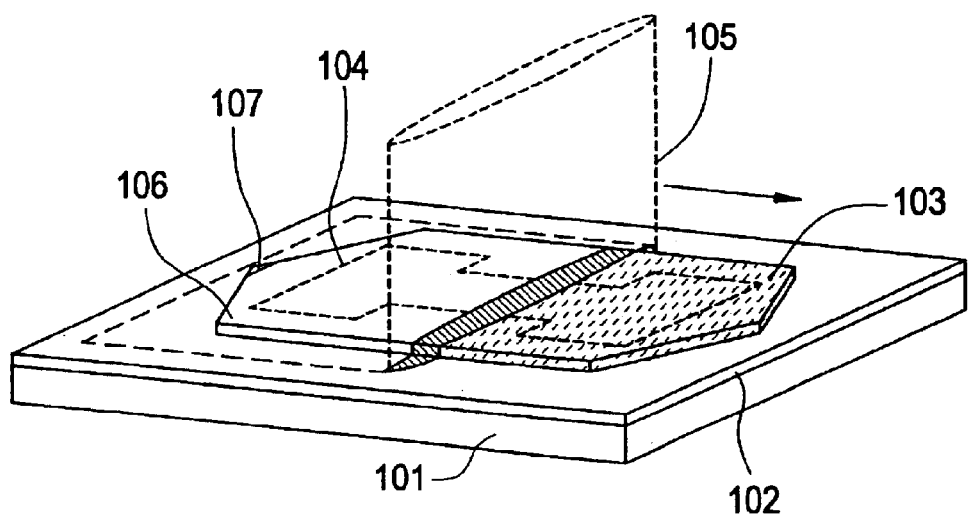
FIGS. 1A through 1C are diagrams for explaining a conception of a method for fabricating a semiconductor device of the present invention.
Figure 1B:
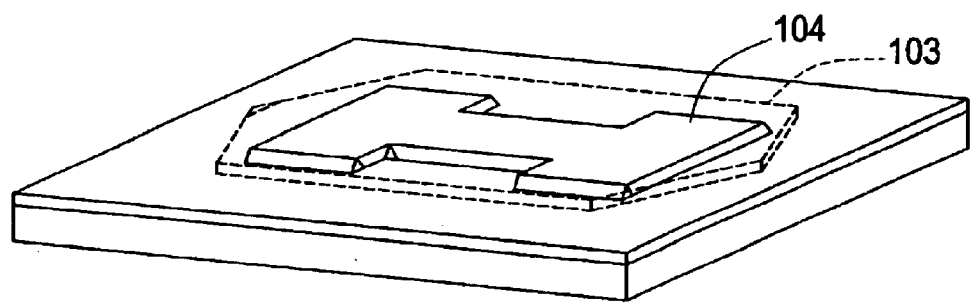
Figure 1C:
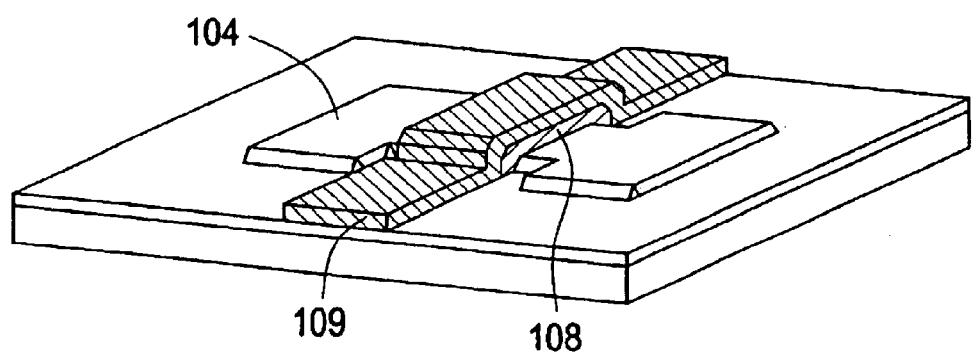
Figure 2:
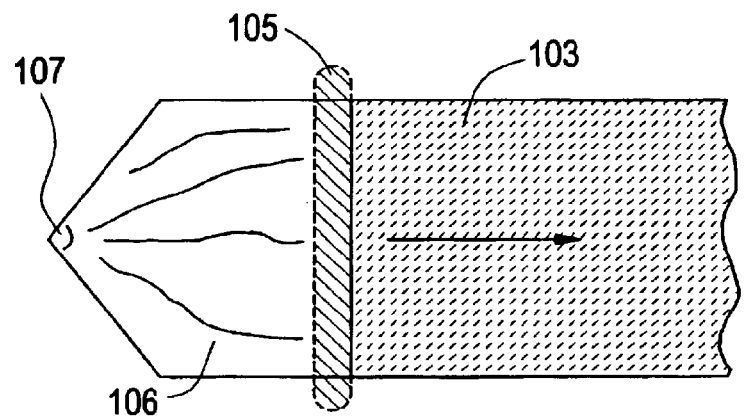
FIG. 2 is a diagram for explaining details of a crystallization process according to the present invention.
Figure 3:
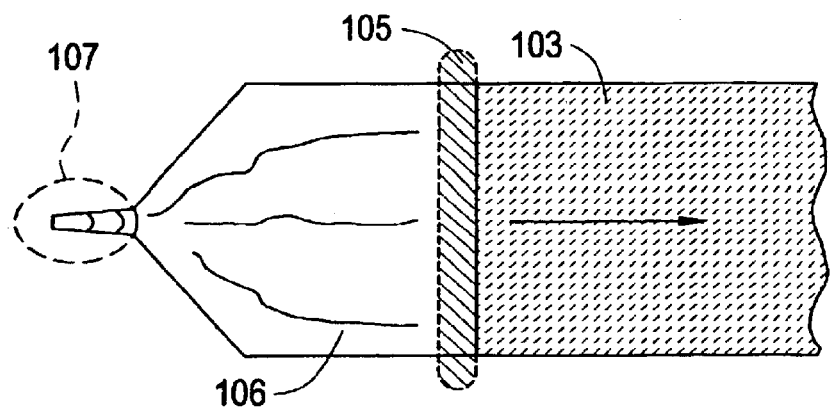
FIG. 3 is a diagram for explaining details of a crystallization process according to the present invention.
Figure 4:
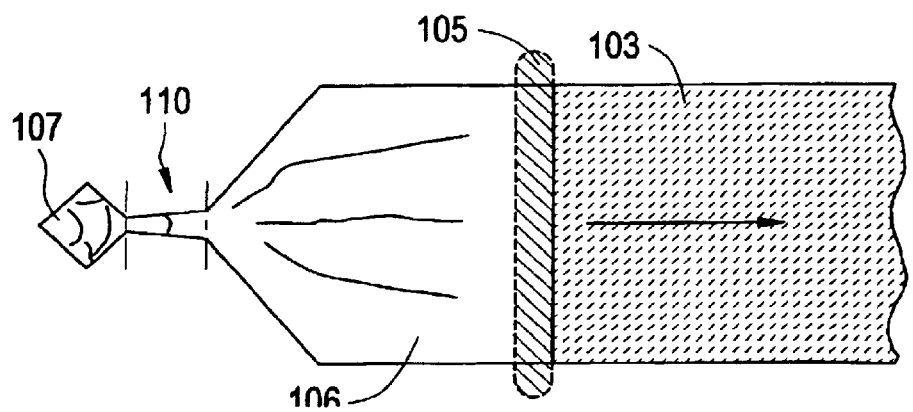
FIG. 4 is a diagram for explaining details of a crystallization process according to the present invention.
Figure 5:
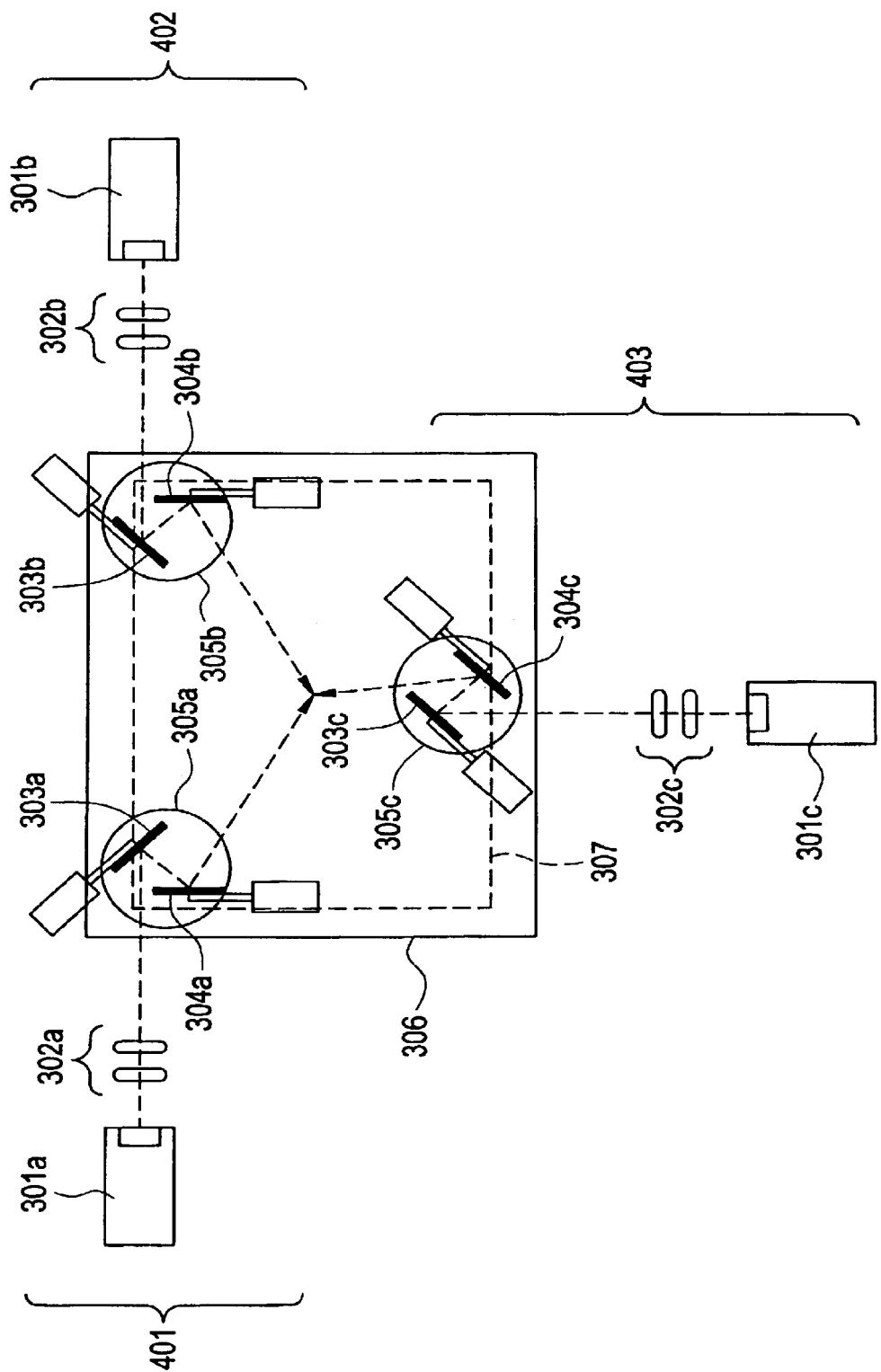
FIG. 5 is a layout drawing showing one mode of a laser irradiator being applied to the present invention.
Figure 7A:
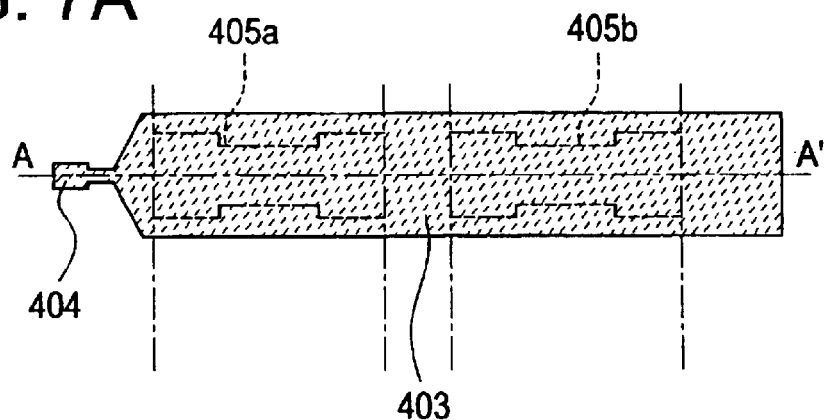
FIGS. 7A and 7B are diagrams for explaining one embodiment of a crystallization process according to the present invention.
Figure 7B:
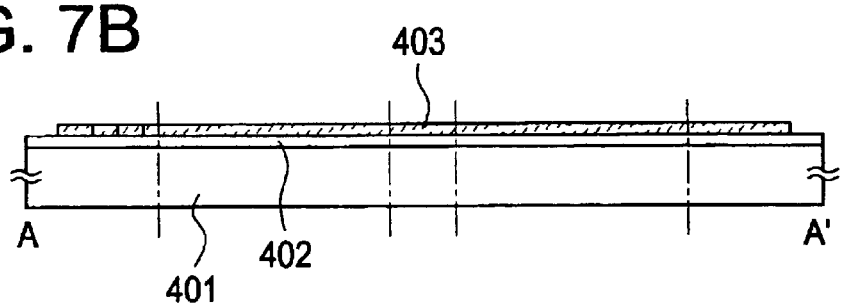
Figure 8A:
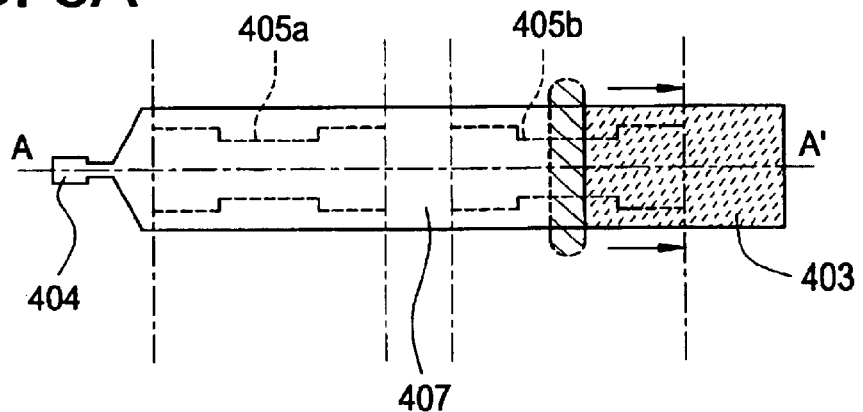
FIGS. 8A and 8B are diagrams for explaining one embodiment of a crystallization process according to the present invention.
Figure 8B:
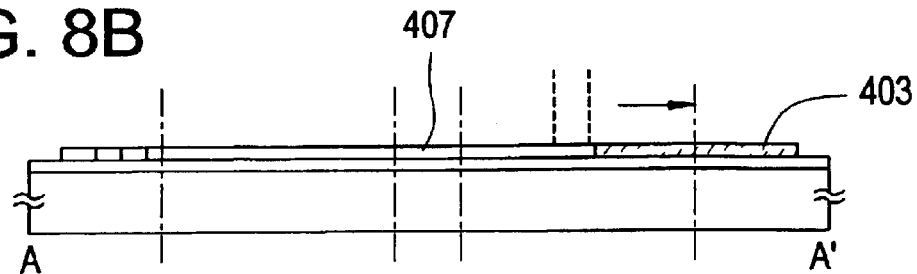
Figure 9A:
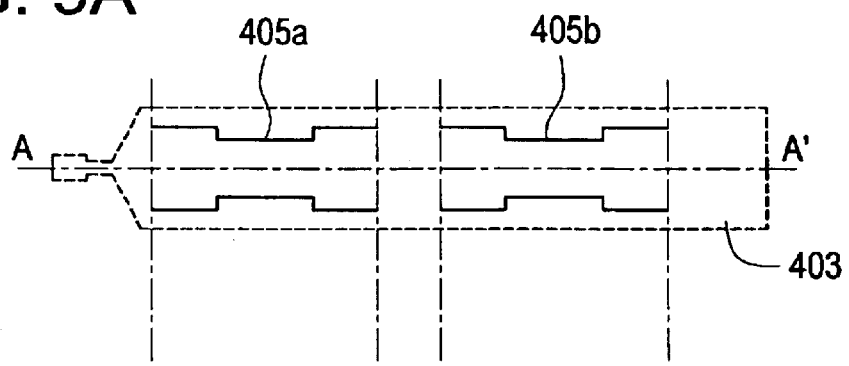
FIGS. 9A and 9B are diagrams for explaining one embodiment of a crystallization process according to the present invention.
Figure 9B:
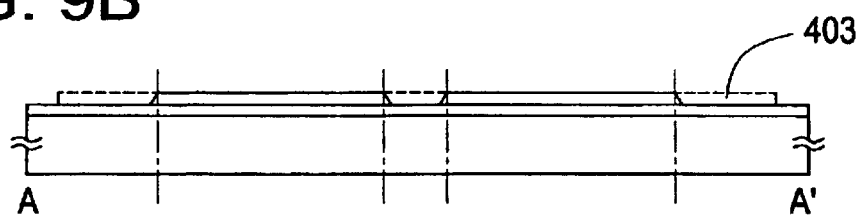
Figure 10A:
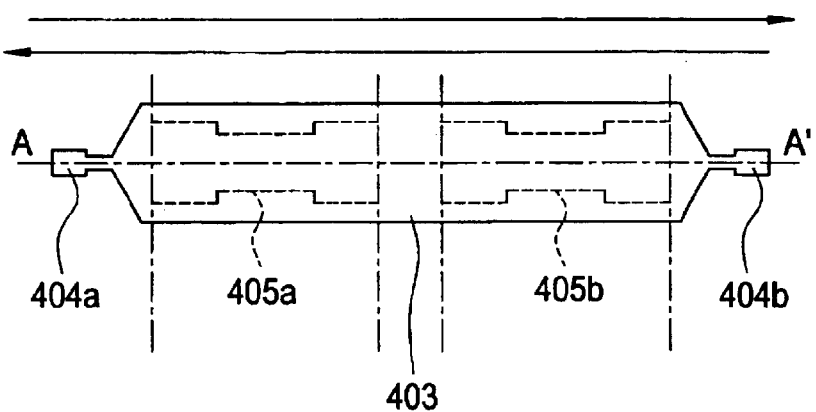
FIGS. 10A and 10B are diagrams for explaining one embodiment of a crystallization process according to the present invention.
Figure 10B:
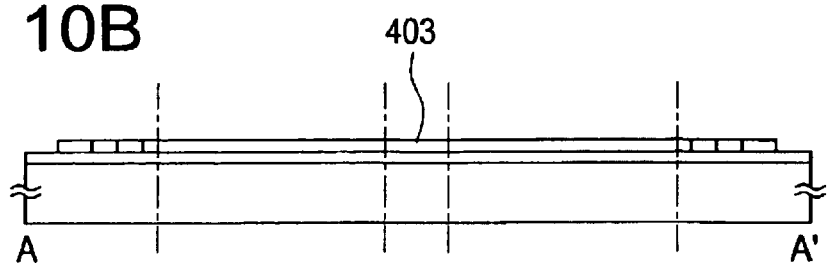
Figure 11A:
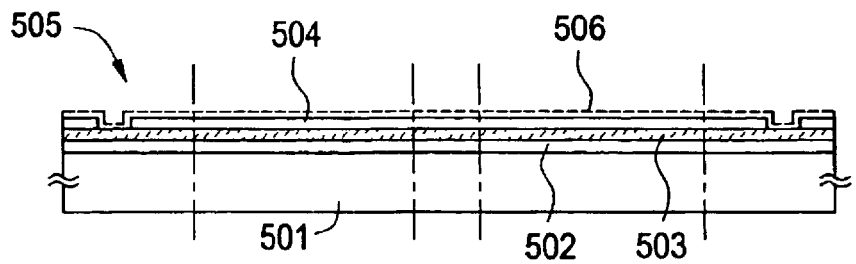
FIGS. 11A through 11C are diagrams for explaining one embodiment of a crystallization process according to the present invention.
Figure 11B:
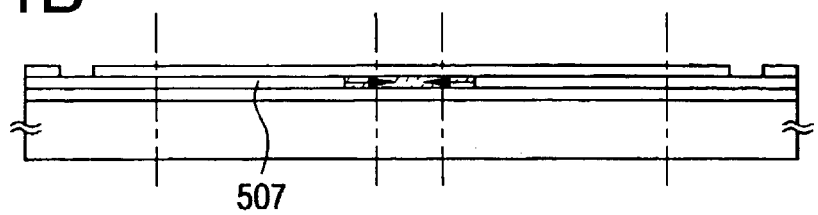
Figure 11C:
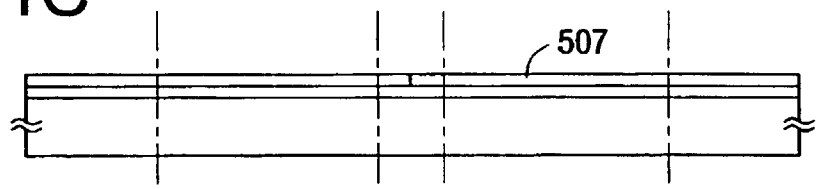
Figure 12A:
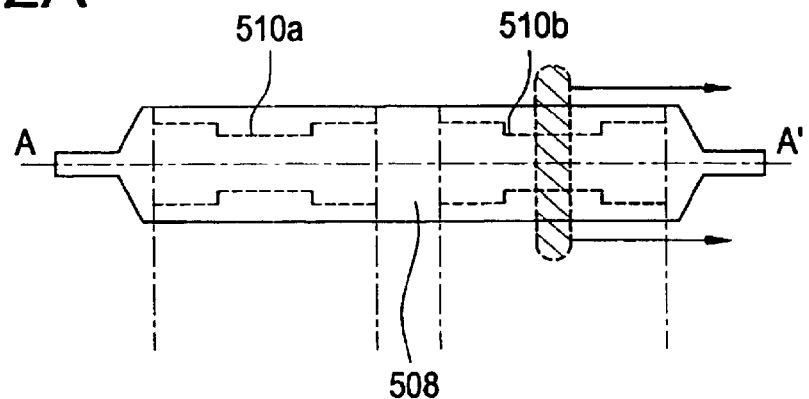
FIGS. 12A and 12B are diagrams for explaining one embodiment of a crystallization process according to the present invention.
Figure 12B:
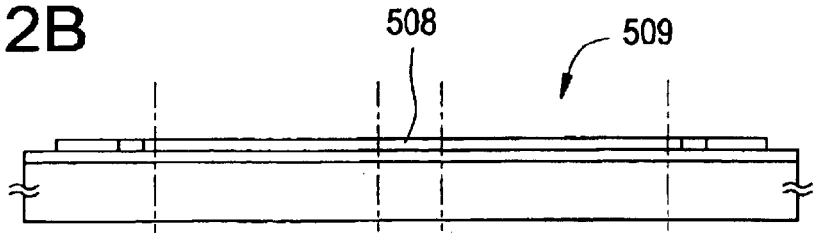
Figure 13A:
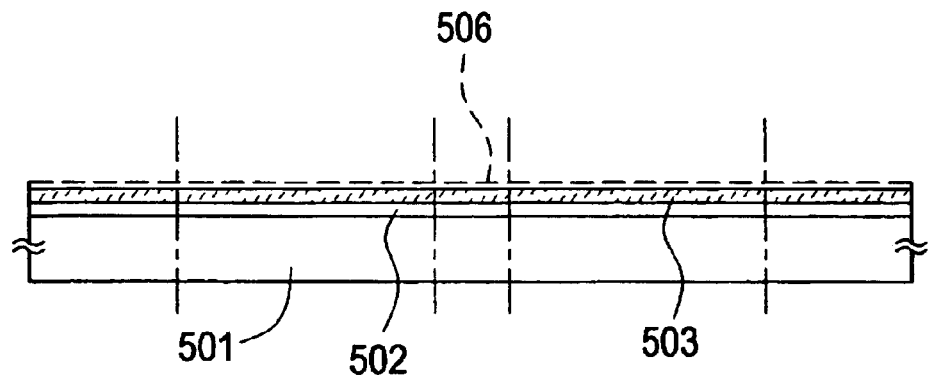
FIGS. 13A and 13B are diagrams for explaining one embodiment of a crystallization process according to the present invention.
Figure 13B:
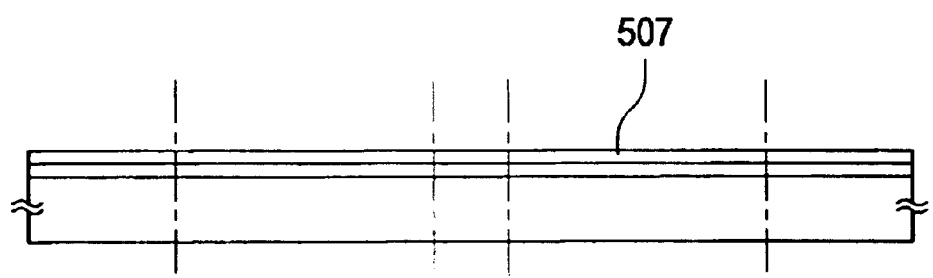
Figure 14:
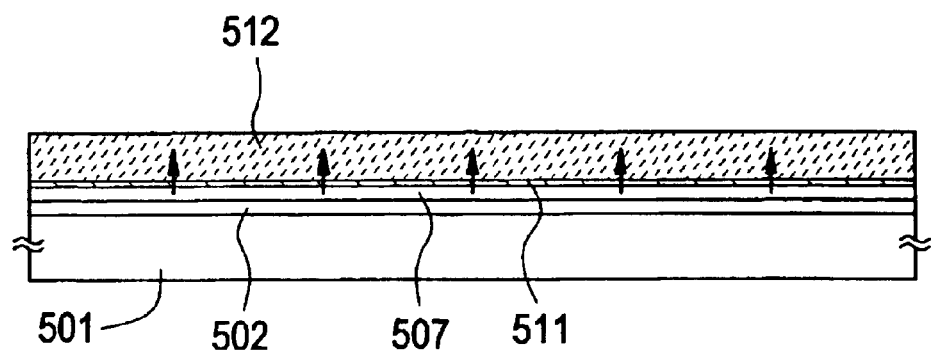
FIGS. 14 is a diagram for explaining one embodiment of a crystallization process according to the present invention.
Figure 15A:
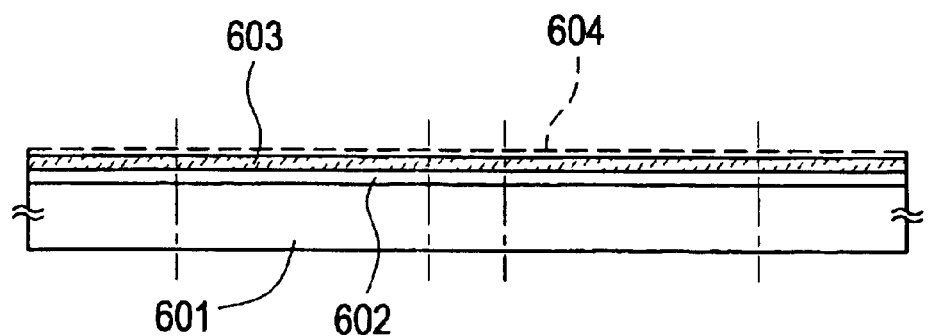
FIGS. 15A through 15C are diagrams for explaining one embodiment of a crystallization process according to the present invention.
Figure 15B:
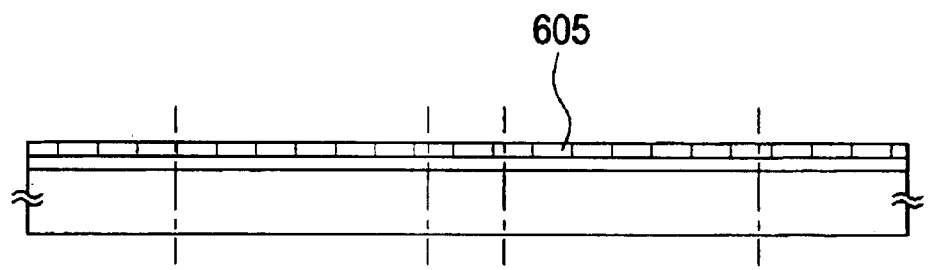
Figure 15C:
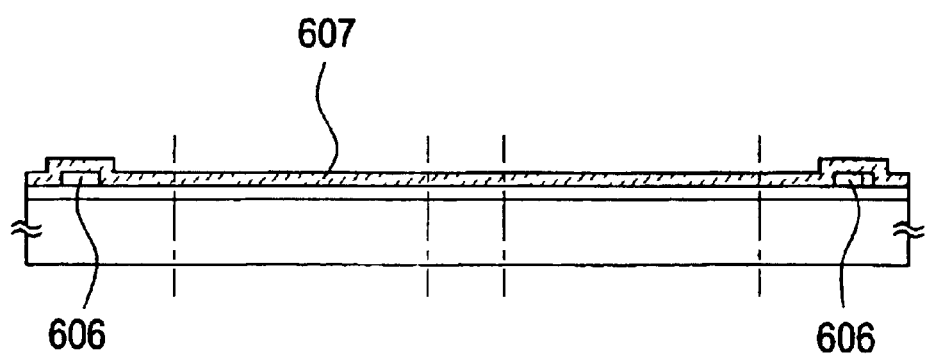
Figure 16A:
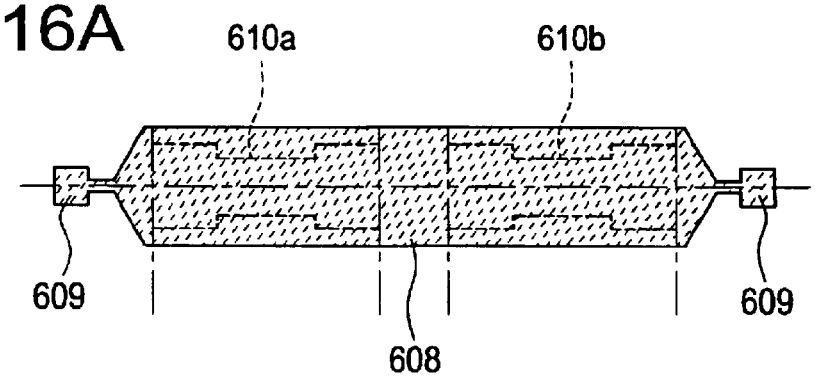
FIGS. 16A and 16B are diagrams for explaining one embodiment of a crystallization process according to the present invention.
Figure 16B:
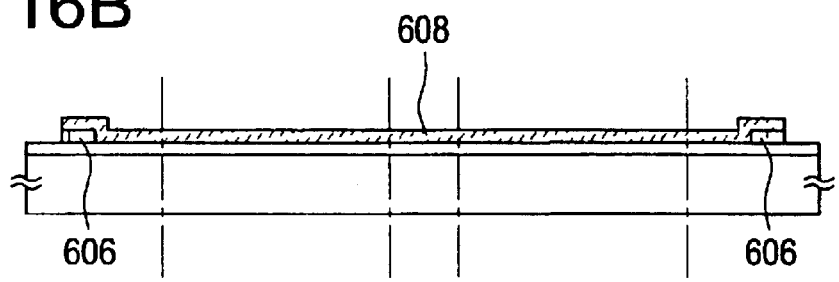
Figure 17A:
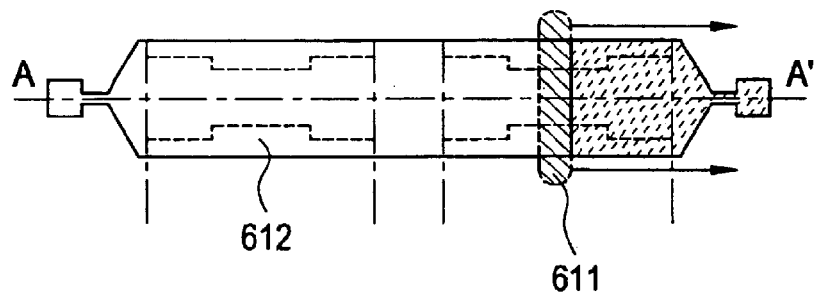
FIGS. 17A and 17B are diagrams for explaining one embodiment of a crystallization process according to the present invention.
Figure 17B:
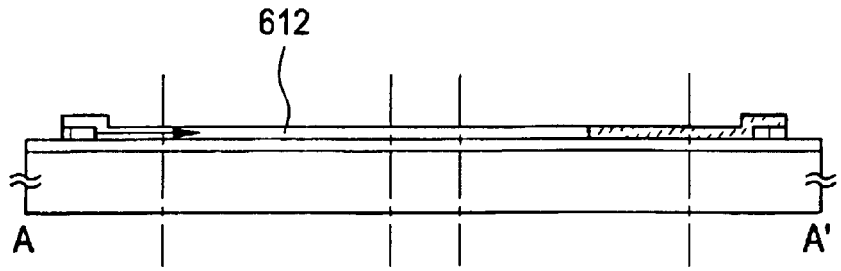
Figure 18A:
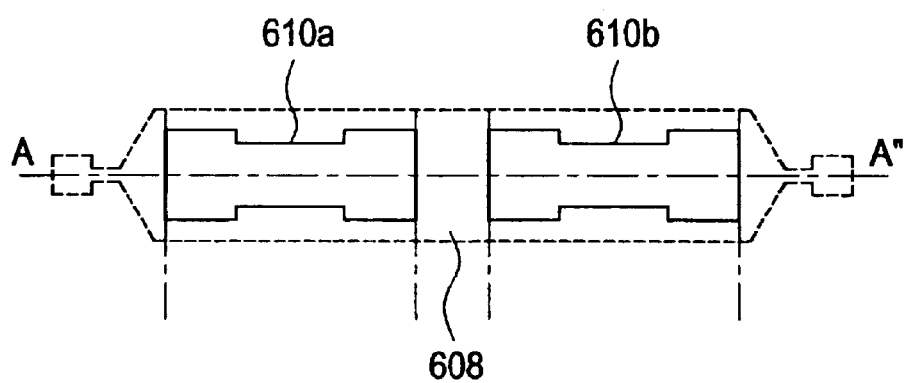
FIGS. 18A and 18B are diagrams for explaining one embodiment of a crystallization process according to the present invention.
Figure 18B:
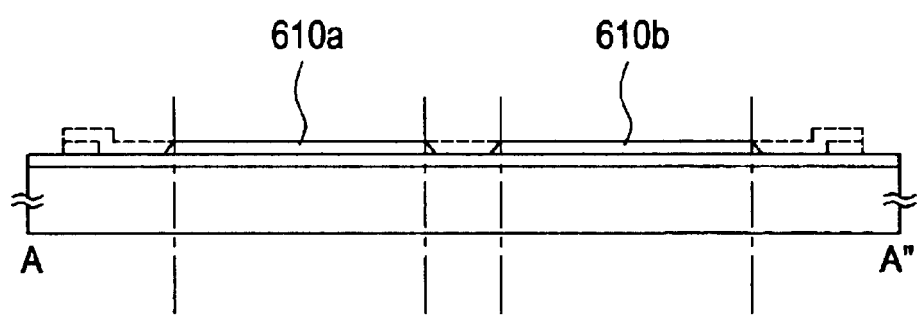
Figure 19A:
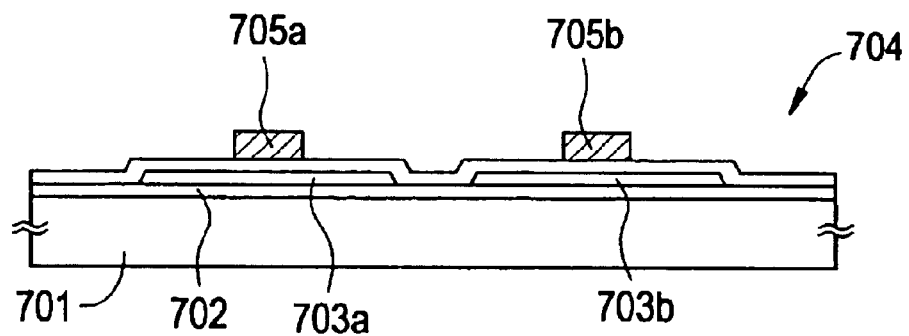
FIGS. 19A through 19C are sectional views for explaining a fabricating process of a TFT.
Figure 19B:
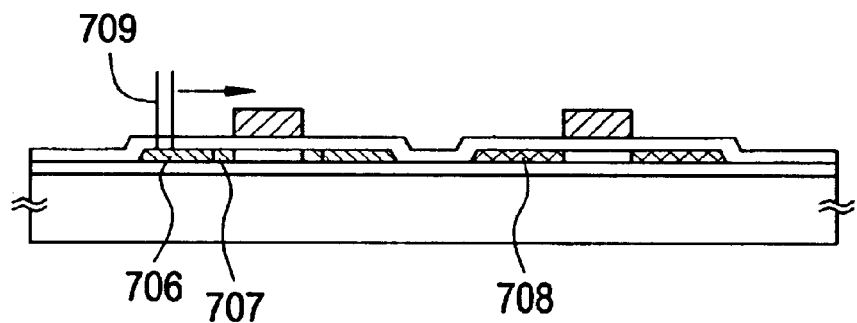
Figure 19C:
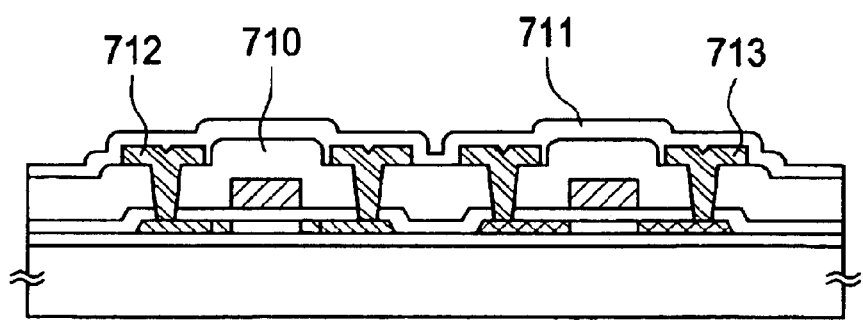
Figure 20:
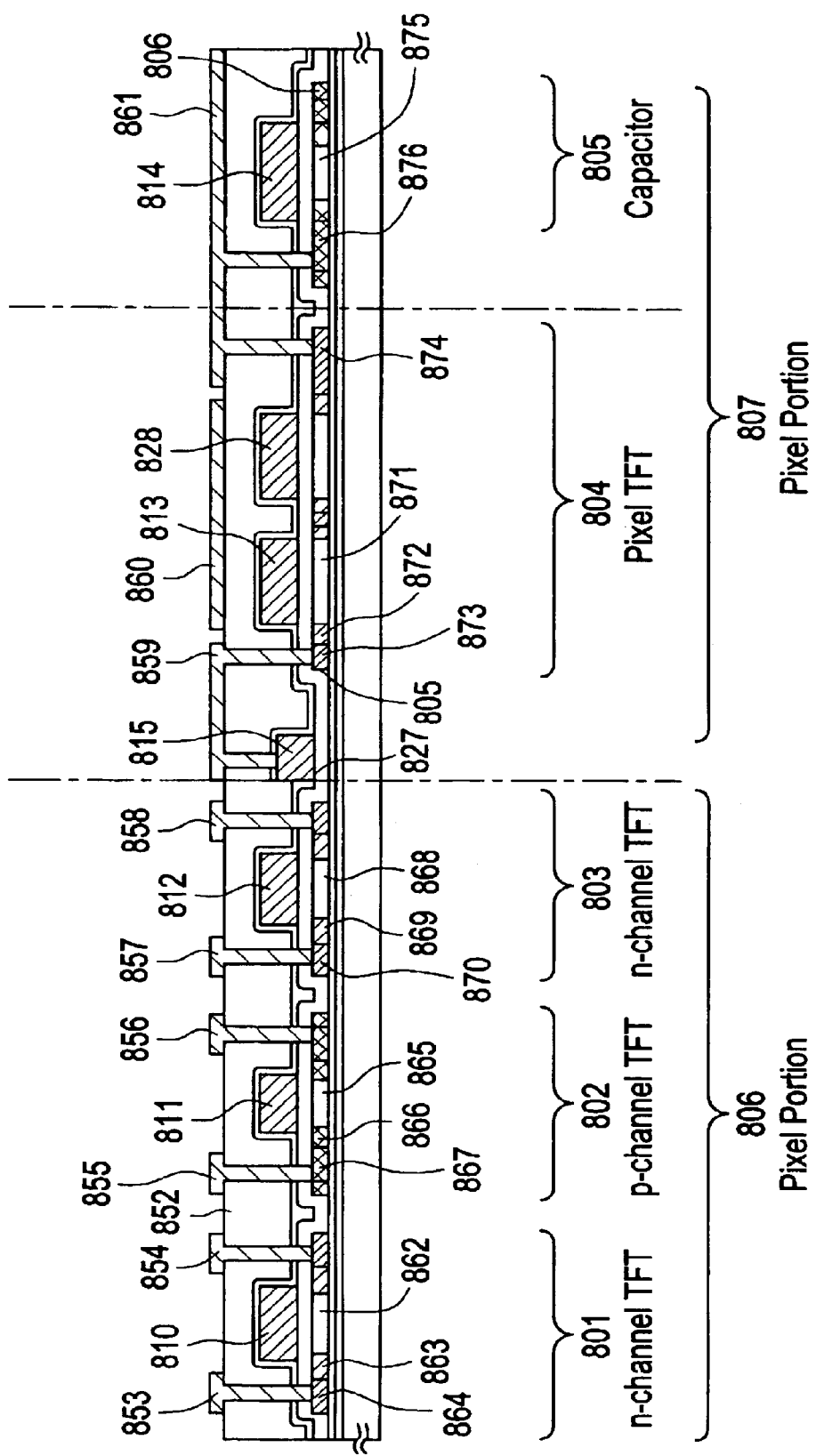
FIG. 20 is a sectional view showing a configuration of a TFT substrate.
Figure 21:
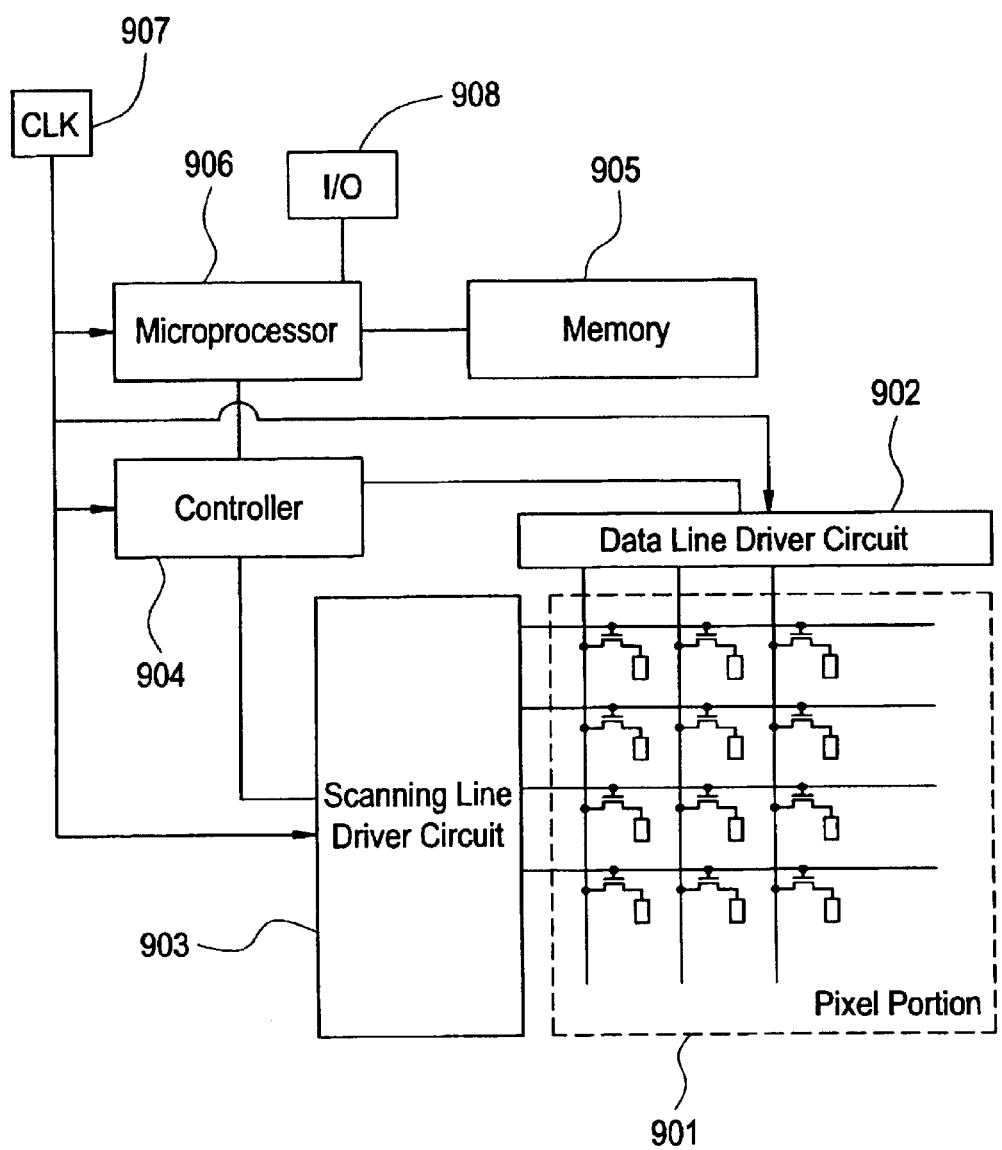
FIG. 21 is a block diagram showing one example of a circuit configuration of a TFT substrate.
Figure 22A:
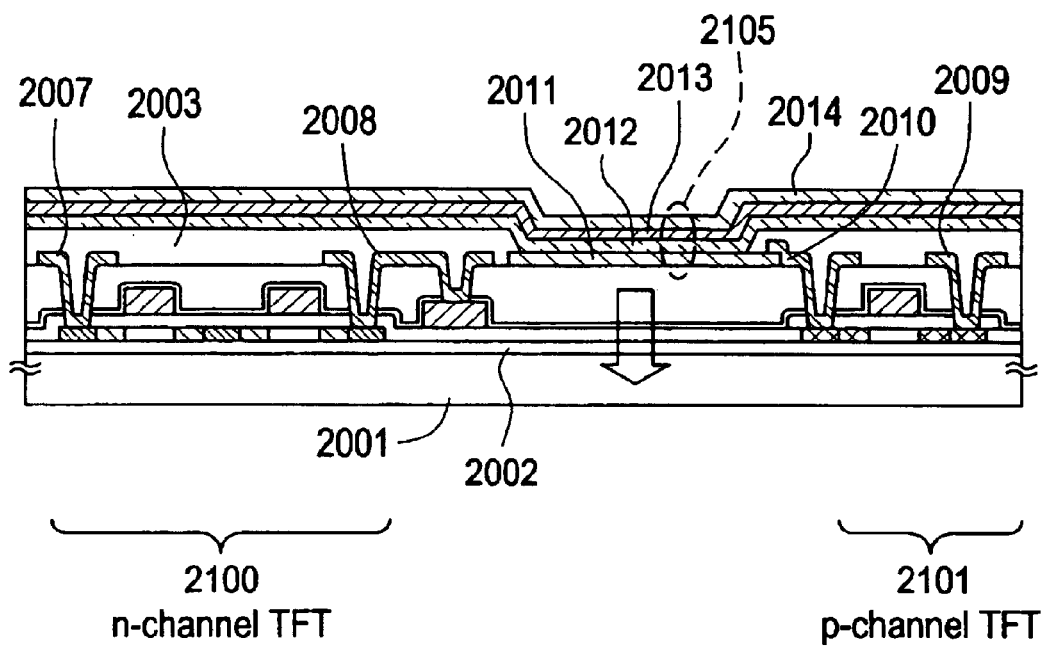
FIGS. 22A and 22B are sectional views showing a configuration of a pixel of a semiconductor device provided with a light-emitting element.
Figure 22B:
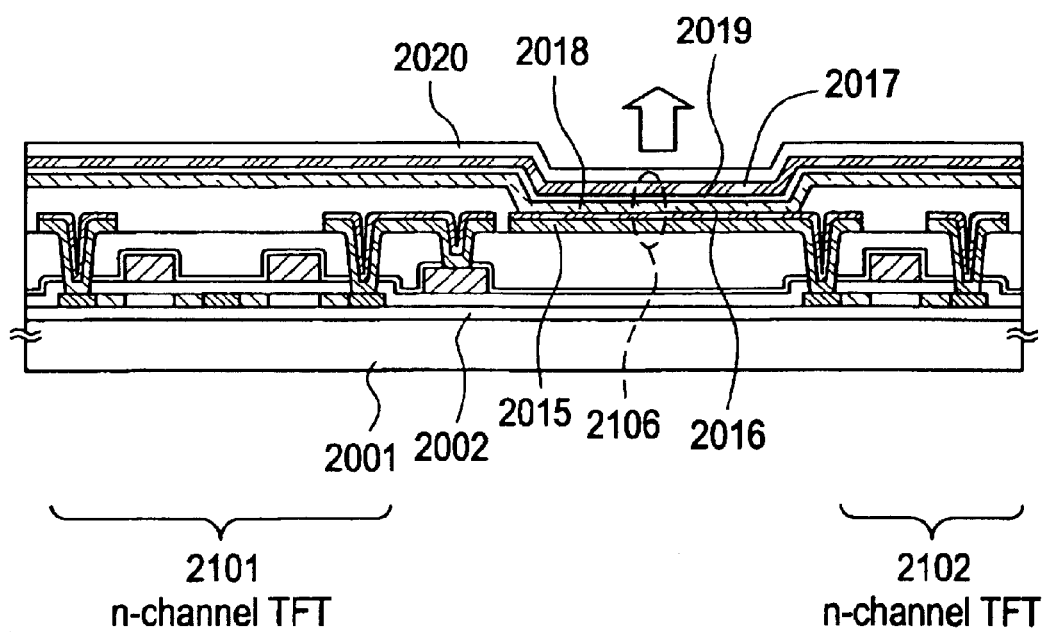
Figure 24A:
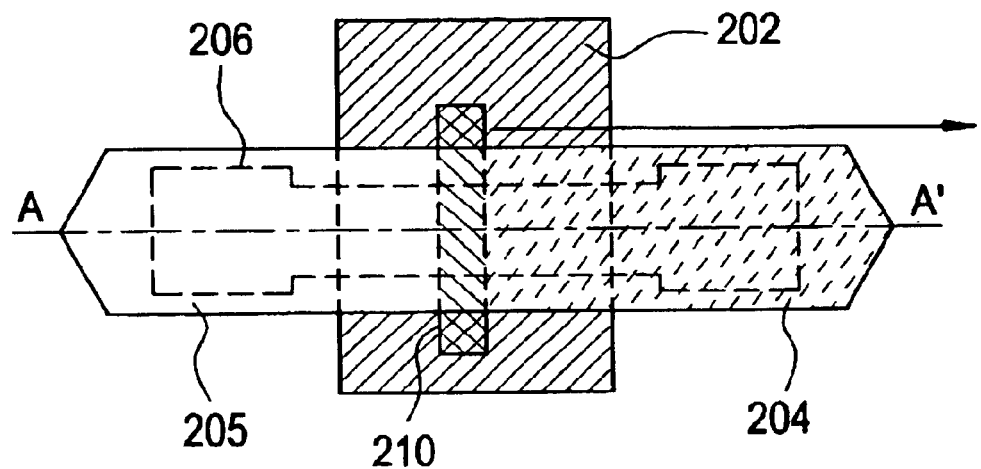
FIGS. 24A and 24B are sectional views for explaining a fabricating process of an active layer corresponding to a bottom gate type TFT.
Figure 24B:
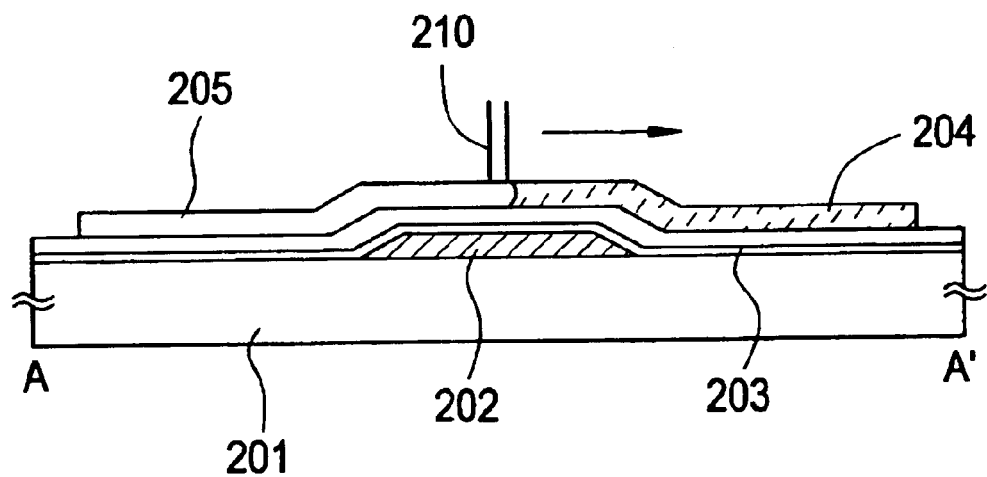
Figure 25:
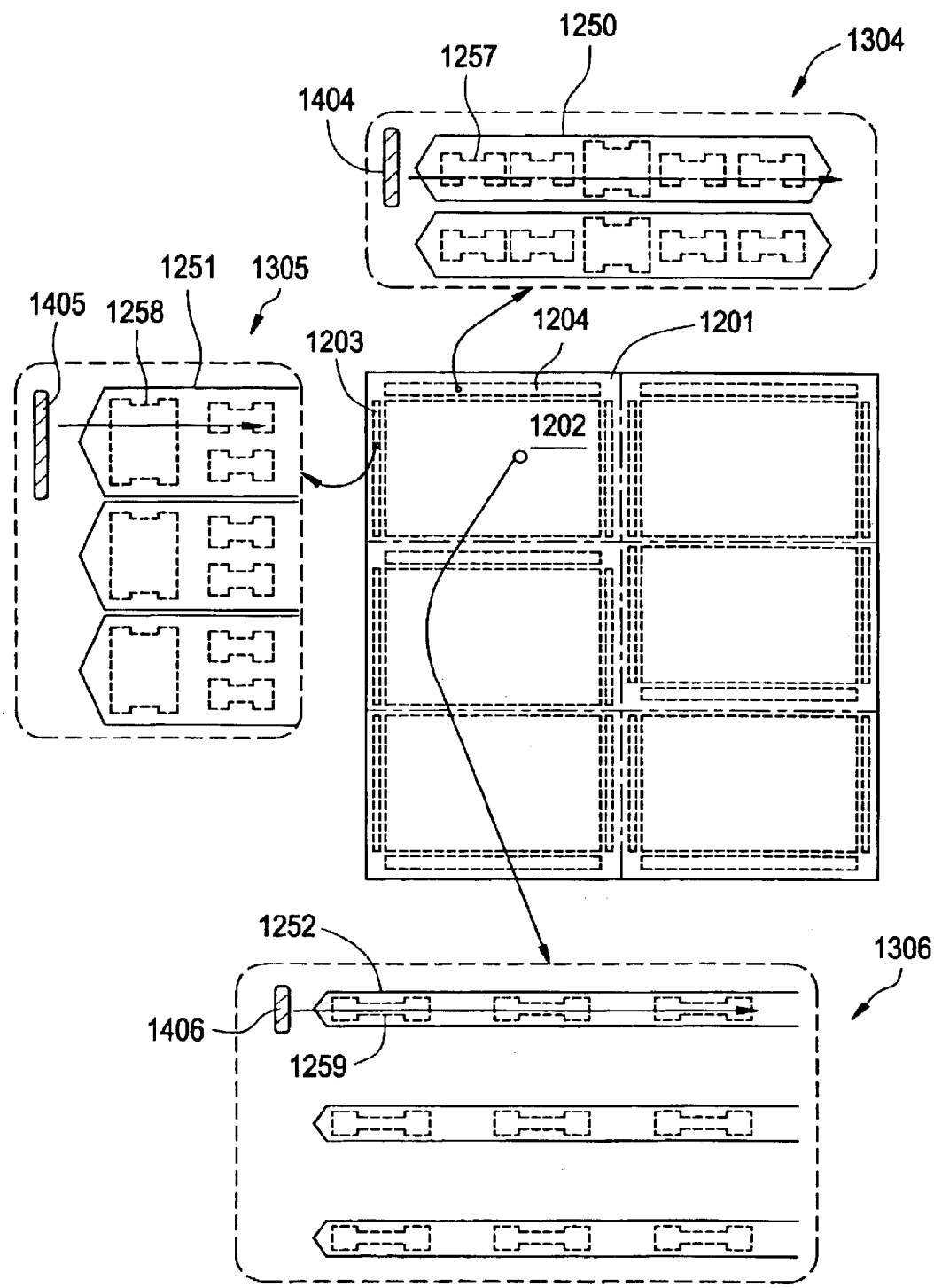
FIG. 25 including enlarged diagrams is a diagram for explaining a configuration of a TFT substrate, and relationship between an arrangement of a semiconductor region constituting a TFT and a scanning direction of a laser beam.
Figure 26A:
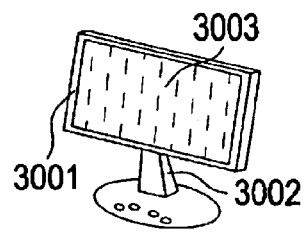
FIGS. 26A through 26G are diagrams showing examples of semiconductor devices.
Figure 26B:
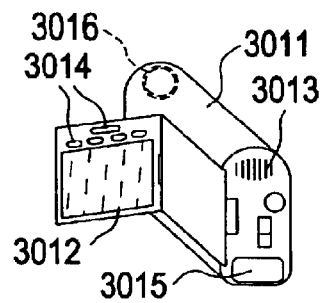
Figure 26C:
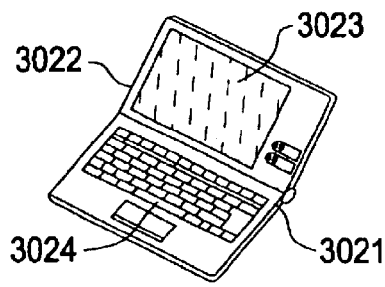
Figure 26D:
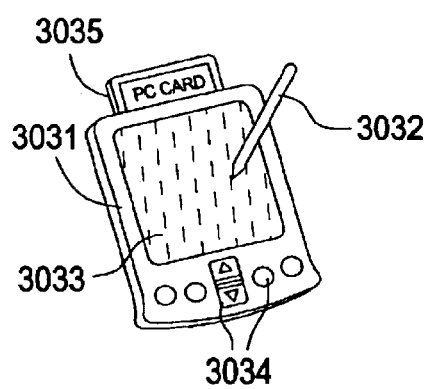
Figure 26E:
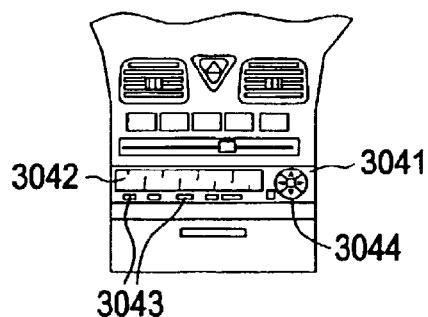
Figure 26G:
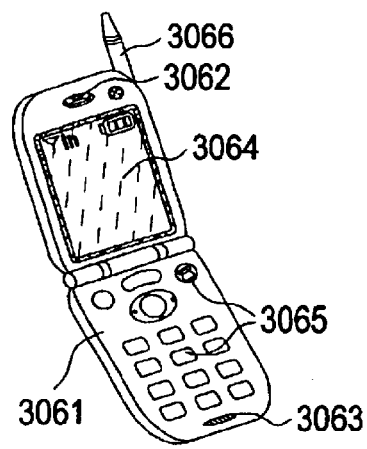
Figure 26F:
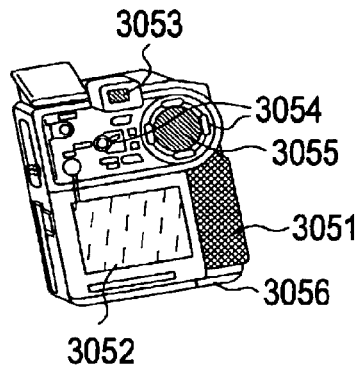
Figure 27A:
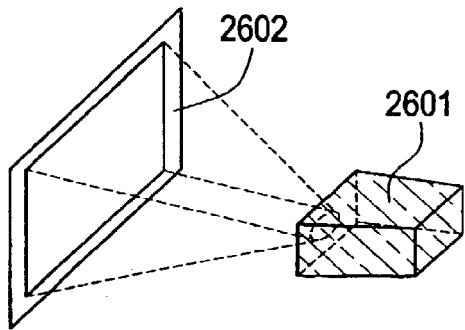
FIGS. 27A through 27D are diagrams showing examples of semiconductor devices.
Figure 27B:
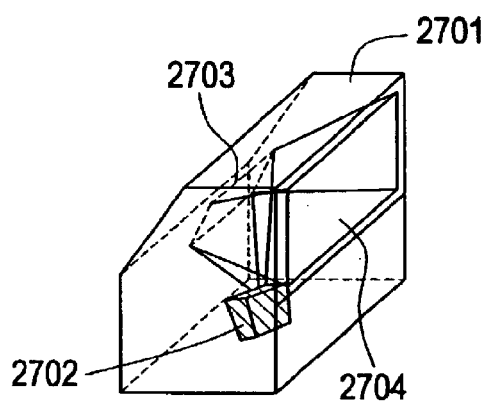
Figure 27C:
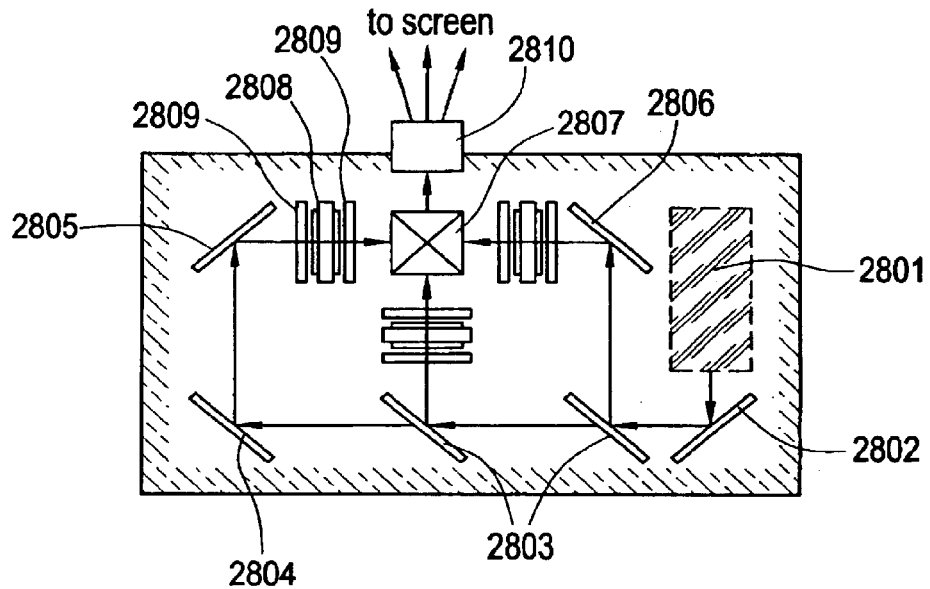
Figure 27D:
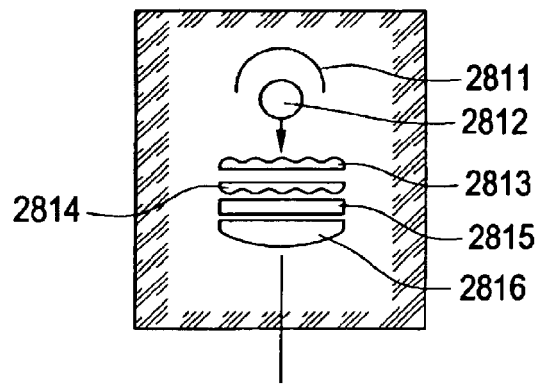
Figure 28:
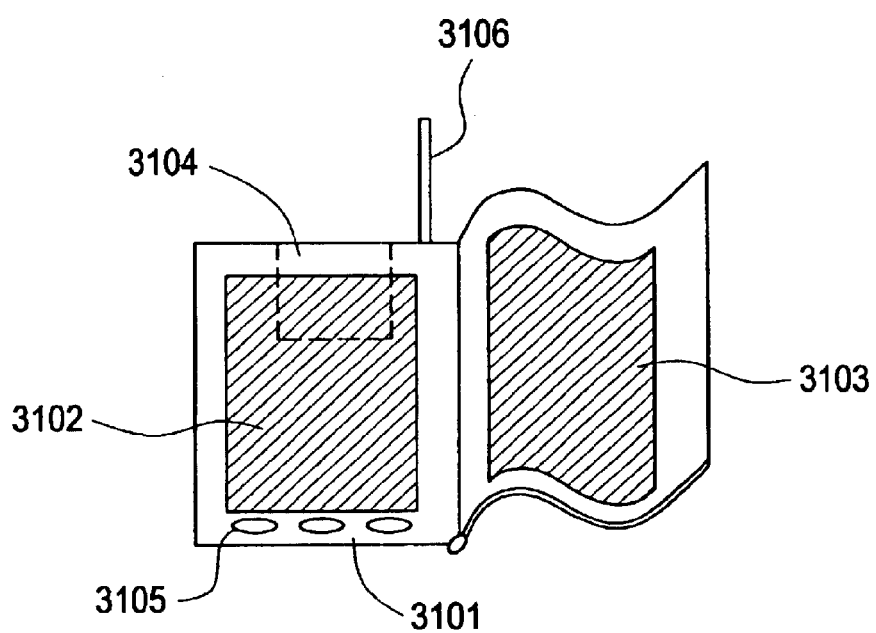
FIG. 28 is a diagram showing one example of a semiconductor device.

What is claimed is:

1. A method for fabricating a semiconductor device having a thin film transistor, including;
   forming a first semiconductor region on an insulating surface;
   scanning a continuous wave laser beam from one end of the first semiconductor region to the other end thereof, and thereby crystallizing the first semiconductor region; and
   etching the first semiconductor region, and thereby forming a second semiconductor region so that a scanning direction of the laser beam roughly coincides with a channel length direction in a thin film transistor.

2. A method for fabricating a semiconductor device having a thin film transistor, including;
   forming a first semiconductor region on an insulating surface;
   scanning a continuous wave laser beam from one end of the first semiconductor region to the other end thereof, thereby crystallizing the first semiconductor region;
   forming an amorphous semiconductor film on the first semiconductor region;
   heating and thereby allowing a metal element to segregate in the amorphous semiconductor film; and
   etching the first semiconductor region, and thereby forming a second semiconductor region so that a scanning direction of the laser beam roughly coincides with a channel length direction in a thin film transistor.

3. A method for fabricating a semiconductor device having a thin film transistor, including;
   forming an amorphous semiconductor film on an insulating surface;
   adding a catalyst element, heating and crystallizing the amorphous semiconductor film, and thereby forming a crystalline semiconductor film;
   patterning the crystalline semiconductor film to form a first semiconductor region;
   scanning a continuous wave laser beam from one end of the first semiconductor region to the other end thereof, and thereby improving crystallinity of the first semiconductor region; and
   patterning the first semiconductor region to form a second semiconductor region so that a scanning direction of the laser beam roughly coincides with a channel length direction in a thin film transistor.

4. A method for fabricating a semiconductor device having a thin film transistor, including;

forming an amorphous semiconductor film on an insulating surface;

selectively adding a catalyst element, heating and crystallizing the amorphous semiconductor film from a region where the catalyst element is selectively added to a direction in parallel with the insulating surface, and thereby forming a crystalline semiconductor film;

patterning the crystalline semiconductor film to form a first semiconductor region;

scanning a continuous wave laser beam in the first semiconductor region in a direction roughly coinciding with a crystal growth direction, and thereby improving crystallinity of the first semiconductor region; and patterning the first semiconductor region to form a second semiconductor region so that a scanning direction of the laser beam roughly coincides with a channel length direction in a thin film transistor.

5. A method for fabricating a semiconductor device having a thin film transistor as set forth in any one of claims 3 and 4 wherein the continuous wave laser beam is irradiated with a plurality of laser beams superposed at a surface being irradiated.

6. A method for fabricating a semiconductor device having a thin film transistor as set forth in any one of claims 3, 4 and 5 wherein a wavelength of the continuous wave laser beam is in the range of from 400 to 700 nm.

7. A method for fabricating a semiconductor device having a thin film transistor comprising the steps of:

forming an amorphous semiconductor film on an insulating surface;

adding a catalyst element to the amorphous semiconductor film;

forming a crystalline semiconductor film by heating the amorphous semiconductor film;

forming a first semiconductor region by patterning the crystalline semiconductor film;

scanning a continuous wave laser beam from one end of the first semiconductor region to the other end thereof; and forming a second semiconductor region by patterning the first semiconductor region so that a scanning direction of the continuous wave laser beam roughly coincides with a channel length direction in the thin film transistor.

8. A method for fabricating a semiconductor device having a thin film transistor comprising the steps of:

forming an amorphous semiconductor film on an insulating surface;

adding a catalyst element to the amorphous semiconductor film;

forming a crystalline semiconductor film by heating the amorphous semiconductor film;

forming a first semiconductor region by patterning the crystalline semiconductor film;

improving a crystallinity of the first semiconductor region by scanning a continuous wave laser beam from one end of the first semiconductor region to the other end thereof; and forming a second semiconductor region by patterning the first semiconductor region so that a scanning direction of the continuous wave laser beam roughly coincides with a channel length direction in the thin film transistor.

9. A method for fabricating a semiconductor device having a thin film transistor comprising the steps of:

forming an amorphous semiconductor film on an insulating surface;

adding a catalyst element to the amorphous semiconductor film;

forming a crystalline semiconductor film by heating the amorphous semiconductor film;

forming a first semiconductor region by patterning the crystalline semiconductor film;

scanning a continuous wave laser beam from one end of the first semiconductor region to the other end thereof; and forming a second semiconductor region by patterning the first semiconductor region so that crystal grains of the second semiconductor region is elongated in a scanning direction of the continuous wave laser beam.

10. A method for fabricating a semiconductor device having a thin film transistor comprising the steps of:

forming an amorphous semiconductor film on an insulating surface;

adding a catalyst element to the amorphous semiconductor film;

forming a crystalline semiconductor film by heating the amorphous semiconductor film;

forming a first semiconductor region by patterning the crystalline semiconductor film;

improving a crystallinity of the first semiconductor region by scanning a continuous wave laser beam from one end of the first semiconductor region to the other end thereof; and forming a second semiconductor region by patterning the first semiconductor region so that crystal grains of the second semiconductor region is elongated in a scanning direction of the continuous wave laser beam.

11. A method for fabricating a semiconductor device having a thin film transistor as set forth in any one of claims 7 through 10 wherein the continuous wave laser beam is irradiated with a plurality of laser beams superposed at a surface being irradiated.

12. A method for fabricating a semiconductor device having a thin film transistor as set forth in any one of claims 7 through 10 wherein a wavelength of the continuous wave laser beam is in the range of from 400 to 700 nm.

* * * * *